United States Patent
Tsang et al.

(10) Patent No.: US 9,890,244 B2
(45) Date of Patent: *Feb. 13, 2018

(54) THERMALLY DECOMPOSABLE POLYMER COMPOSITIONS INCORPORATING THERMALLY ACTIVATED BASE GENERATORS

(71) Applicant: SUMITOMO BAKELITE CO., LTD., Tokyo (JP)

(72) Inventors: W. C. Peter Tsang, Brecksville, OH (US); Andrew Bell, Brecksville, OH (US)

(73) Assignee: SUMITOMO BAKELITE CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/798,610

(22) Filed: Jul. 14, 2015

(65) Prior Publication Data

US 2015/0337081 A1 Nov. 26, 2015

Related U.S. Application Data

(63) Continuation of application No. 13/524,511, filed on Jun. 15, 2012, now Pat. No. 9,115,300.

(60) Provisional application No. 61/497,232, filed on Jun. 15, 2011.

(51) Int. Cl.
| | | |
|---|---|---|
| *C08K 5/19* | (2006.01) | |
| *B23K 35/36* | (2006.01) | |
| *C08G 64/16* | (2006.01) | |
| *C09J 169/00* | (2006.01) | |
| *H05K 3/30* | (2006.01) | |
| *C08K 5/3462* | (2006.01) | |
| *C08K 5/3442* | (2006.01) | |
| *C08K 5/09* | (2006.01) | |
| *C08G 64/02* | (2006.01) | |
| *C08K 5/3467* | (2006.01) | |
| *C08K 5/17* | (2006.01) | |
| *C08K 5/31* | (2006.01) | |
| *C08K 5/3415* | (2006.01) | |
| *C08K 5/3445* | (2006.01) | |
| *H05K 3/34* | (2006.01) | |

(52) U.S. Cl.
CPC ...... *C08G 64/1608* (2013.01); *B23K 35/3613* (2013.01); *B23K 35/3615* (2013.01); *C08K 5/19* (2013.01); *C09J 169/00* (2013.01); *H05K 3/303* (2013.01); *B23K 35/3618* (2013.01); *C08G 64/0208* (2013.01); *C08K 5/09* (2013.01); *C08K 5/175* (2013.01); *C08K 5/31* (2013.01); *C08K 5/3415* (2013.01); *C08K 5/3442* (2013.01); *C08K 5/3445* (2013.01); *C08K 5/3462* (2013.01); *C08K 5/3467* (2013.01); *C08L 2205/02* (2013.01); *H05K 3/3436* (2013.01); *H05K 3/3489* (2013.01); *Y02P 70/613* (2015.11)

(58) Field of Classification Search
None
See application file for complete search history.

(56) References Cited

U.S. PATENT DOCUMENTS

| | | |
|---|---|---|
| 5,177,134 A | 1/1993 | Mullen, III et al. |
| 5,545,509 A | 8/1996 | Cameron et al. |
| 5,929,193 A | 7/1999 | Greco |
| 6,177,360 B1 | 1/2001 | Carter et al. |
| 9,115,300 B2 * | 8/2015 | Tsang ............... B23K 35/3615 |
| 9,505,948 B2 * | 11/2016 | Tsang ............... B23K 35/3613 |
| 9,527,957 B2 * | 12/2016 | Tsang ................ C07D 303/04 |
| 9,757,818 B2 * | 9/2017 | Tsang .................. B23K 35/36 |
| 2009/0294515 A1 | 12/2009 | Prack et al. |
| 2011/0257296 A1 * | 10/2011 | LaPointe ........... C08G 64/0208 523/400 |

FOREIGN PATENT DOCUMENTS

| | | | |
|---|---|---|---|
| JP | 2010-084144 A | | 4/2010 |
| JP | 2010084144 A | * | 4/2010 |
| WO | WO 2010/075232 A1 | | 7/2010 |

OTHER PUBLICATIONS

Jayachandran, J. P. et al., J. Microelectromechanical Systems 2003, 12(2), 147-159. "Air-Channel Fabrication for Microelectromechanical Systems via Sarificial Photosensitive Polycarbonates."*
Katritzky, A. R., "Short Course of Heterocyclic Chemistry. Lecture 3. Reactions of C-Linked and N-Linked Substitutents." Archived on the Internet Archive on Jun. 26, 2010.*
Thesis of Xun Sun, "Development of Tetraphenylborate-based Photobase Generators and Sacrificial Polycarbonates for Radiation Curing and Photoresist Applications." Carleton University, Ottawa, Ontario, Canada, Nov. 2008.*
Acros Organics N.V., Material Safety Data Sheet for tetraethylammonium acetate tetrahydrate. Mar. 16, 2007.*
Winkle, et al., "Acid Hardening Positive Photoresist using Photochemical Generation of Base," Journal of Photopolymer Science and Technology, vol. 3(3), pp. 419-422, 1990.
Miyamoto, et al., "Synthesis of Phenylsulfonylethyl Carbamates as a Base Amplifier and Their Applications to Photopolymer Systems," Journal of Photopolymer Science and Technology, vol. 12(2), pp. 315-316, 1999.

(Continued)

*Primary Examiner* — Richard A Huhn
(74) *Attorney, Agent, or Firm* — Balaram Gupta

(57) ABSTRACT

Embodiments in accordance with the present invention provide sacrifical polymer compositions and methods for fabricating electronic devices using such sacrifical polymer compositions where such methods include (1) providing a tacky sacrificial polymer composition that holds components in a desired alignment to one another, (2) providing solder fluxing for effecting electrical coupling; and (3) thermal decomposition or depolymerization of the sacrificial polymer composition to provide essentially residue free surfaces.

20 Claims, No Drawings

(56) References Cited

OTHER PUBLICATIONS

Jayachandran, J. P. et al., "Air-Channel Fabrication for Microelectromechanical Systems via Sacrificial Photosensitive Polycarbonates," Journal of Microelectromechanical Systems, vol. 12(2), pp. 147-159, 2003.
Aoki, et. al., "UV-Curing of a Novolak Epoxy Resin Enhanced by a Multifunctional Base-amplifier," Journal of Photopolymer Science and Technology, vol. 19(6), pp. 683-684, 2006.
Acros Organics NY, Material Safety Data Sheet for tetraethylammonium acetate tetrahydrate. Mar. 16, 2007.
Thesis of Xun Sun, "Development of Tetraphenylborate-based Photobase Generators and Sacrificial Polycarbonates for Radiation Curing and Photoresist Applications." Carleton University, Ottawa, Ontario, Canada. Nov. 2008.
Arimitsu, et al., "Novel Photobase Generators and Their Application to Photopolymers," Journal of Photopolyrner Science and Technology, vol. 22(5), pp. 663-666, 2009.
Arimitsu, et al., "Photochemical Generation of Superbases and Its Application to Photoreactive Materials," vol. 23(1), pp. 135-136, 2010.
Katritzky, A. R., "Short Course on Heterocyclic Chemistry. Lecture 3. Reactions of C-Linked and N-Linked Substituents." Archived on the Internet Archive on Jun. 26, 2010.

* cited by examiner

THERMALLY DECOMPOSABLE POLYMER COMPOSITIONS INCORPORATING THERMALLY ACTIVATED BASE GENERATORS

CROSS-REFERENCE TO RELATED APPLICATION

This application is a continuation of U.S. application Ser. No. 13/524,511, filed Jun. 15, 2012, now allowed, which claims the benefit of U.S. Provisional Application No. 61/497,232 filed Jun. 15, 2011, both of which are incorporated herein by reference in their entirety.

TECHNICAL FIELD

The present invention relates generally to thermally decomposable polymer compositions and more specifically to such compositions that incorporate a thermally activated base generator (TABG) where such compositions are useful in forming microelectronic structures and assemblies where for such assemblies the thermally decomposable polymer compositions provide both tackiness and solder fluxing.

BACKGROUND

While assembled electronic circuitry has been dramatically reduced in size the use of soldering as a method for forming both an electrical and fixable attachment of electronic components to a substrate has remained quite prevalent. However, such attachments generally require that the electronic components be held in desired positions prior to completing the aforementioned fixable attachments.

A number of solutions for holding components in such desired positions have been developed and used with some success. For example, it is known to use a tack agent to temporarily secure such components in desired positions while solder bond or solder ball connections are made through the application of heat. However, generally such tack agent remains as a contaminant that requires the assembly to be subjected to an extra processing step designed to remove such contamination. For some of the aforementioned solutions, a fluxing agent is provided separately from the tack agent, for example by applying such fluxing agent in a distinct application step, separate from the application of the tack agent. In other solutions the fluxing agent is provided in a combination with the tack agent, for example where a solder paste is used as the tack agent and fluxing agent is either added thereto or pre-reacted therewith.

In still other solutions, a tack agent and a di-carboxylic acid fluxing agent are admixed where upon soldering, the tack agent either volatilizes or decomposes (see, U.S. Pat. No. 5,177,134). However, as a di-carboxylic acid fluxing agent is taught, it is likely that even small amounts of contamination from such di-carboxylic acid fluxing agent can remain and cause reliability issues if a separate cleaning step is not employed. In US Published Application No. 2009/0294515, embodiments where either specialized process equipment is required for fluxless solder bonding or a carboxylic acid fluxing agent are employed. Therefore new solutions that eliminate the need for such specialized equipment by providing tacking properties and a non-carboxylic acid fluxing agent to achieve desirable solder reflow are needed.

DETAILED DESCRIPTION

Exemplary embodiments in accordance with the present invention are described with reference to the Examples and Claims provided hereinafter. Such embodiments encompassing a polymer composition that provides both tacking properties and a non-carboxylic acid fluxing agent, as well as methods for using such polymer compositions for forming microelectronic and/or optoelectronic devices. Various modifications, adaptations or variations of such exemplary embodiments described herein may become apparent to those skilled in the art as such are disclosed. It will be understood that all such modifications, adaptations or variations that rely upon the teachings of the present invention, and through which these teachings have advanced the art, are considered to be within the scope and spirit of the present invention.

As used herein, the articles "a," "an," and "the" include plural referents unless otherwise expressly and unequivocally limited to one referent.

As used herein, the term "thermal base generator" and similar terms, such as, "thermally activated base generator" and "thermal initiator" means a material that generates one or more bases after heating to an effective temperature.

As used herein, the terms "group" or "groups" when used in relation to a chemical compound and/or representative chemical structure/formula, mean an arrangement of one or more atoms.

As used herein, molecular weight values of polymers, such as weight average molecular weights ($M_w$) and number average molecular weights ($M_n$), are determined by gel permeation chromatography using polystyrene standards for calibration.

As used herein, polydispersity index (PDI) values represent a ratio of the weight average molecular weight ($M_w$) to the number average molecular weight ($M_n$) of the polymer (i.e., $M_w/M_n$).

As used herein, and unless otherwise stated, polymer glass transition temperature ($T_g$) values are determined by differential scanning calorimetry, in accordance with American Society for Testing and Materials (ASTM) method number D3418.

Unless otherwise indicated, all ranges or ratios disclosed herein are to be understood to encompass any and all subranges or subratios subsumed therein. For example, a stated range or ratio of "1 to 10" should be considered to include any and all subranges between (and inclusive of) the minimum value of 1 and the maximum value of 10; that is, all subranges or subratios beginning with a minimum value of 1 or more and ending with a maximum value of 10 or less, such as but not limited to, 1 to 6.1, 3.5 to 7.8, and 5.5 to 10.

Other than in the operating examples, or where otherwise specifically indicated, all numbers expressing quantities of ingredients, reaction conditions, and so forth used in the specification and claims are to be understood as being modified in all instances by the term "about" to take into account the uncertainties associated with determining such values.

As used herein the term "hydrocarbyl" and similar terms, such as "hydrocarbyl group" means a radical of a group that contains carbon and optionally hydrogen, non-limiting examples being alkyl, cycloalkyl, polycycloalkyl, aryl, aralkyl, alkaryl, alkenyl, cycloalkenyl, polycycloalkenyl, alkynyl, cycloalkynyl and polycycloalkynyl. The term "halohydrocarbyl" as used herein means a hydrocarbyl group where at least one hydrogen covalently bonded to a carbon has been replaced by a halogen. The term "perhalocarbyl" as used herein means a hydrocarbyl group where all such hydrogens have been replaced by a halogen. In addition, the term "heterohydrocarbyl" as used herein means a hydrocarbyl group where at least one carbon atom has been replaced with a hetero atom such as oxygen, nitrogen, silicon and/or sulfur.

As used herein, the term "alkyl" means a linear or branched acyclic or cyclic, saturated hydrocarbon group having a carbon chain length of from $C_1$ to $C_{25}$. Nonlimiting examples of suitable alkyl groups include methyl, ethyl, propyl, isopropyl, butyl, isobutyl, sec-butyl, tert-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, isocanyl, cyclopropyl, cyclobutyl, cyclopentyl, cyclohexyl, cycloheptyl and cyclooctyl. As used herein, the term "heterocycloalkyl" means a cycloalkyl group in which one or more carbons of the cyclic ring has been replaced with a hetero atom, such as oxygen, nitrogen, silicon and/or sulfur.

Representative heterocycloalkyl groups include but are not limited to tetrahydrofuranyl, tetrahydropyranyl, morpholinyl, and piperidinyl.

As used herein, the term "alkylene" means a bivalent alkyl group, as described above, having a carbon chain length of from $C_2$ to $C_{25}$.

As used herein, the term "aryl" means aromatic groups that include, without limitation, phenyl, biphenyl, benzyl, xylyl, naphthalenyl, anthracenyl, and the like. As used herein, the term "heteroaryl" means an aryl group in which one or more carbons of the aromatic ring or rings has been replaced with a hetero atom, such as oxygen, nitrogen, silicon and/or sulfur. Representative heteroaryl groups include but are not limited to furanyl, pyranyl and pyridinyl.

The terms "alkaryl" and "aralkyl" are used herein interchangeably and mean a linear or branched acyclic alkyl group substituted with at least one aryl group, for example, phenyl, and having an alkyl carbon chain length of $C_1$ to $C_{25}$. It will further be understood that the above acyclic alkyl group can be a haloalkyl or perhaloalkyl group.

As used herein, the term "alkenyl" means a linear or branched acyclic or cyclic hydrocarbon group having one or more double bonds and having an alkenyl carbon chain length of $C_2$ to $C_{25}$. Non-limiting examples of alkenyl groups include, among others, vinyl, allyl, propenyl, butenyl, pentenyl, hexenyl, heptenyl, octenyl, nonenyl, decenyl, undecenyl, dodecenyl, tridecenyl, tetradecenyl, pentadecenyl, hexadecenyl, heptadecenyl, octadecenyl, nonadecenyl, and isocenyl, and the like.

As used herein, the term "alkynyl" means a linear or branched acyclic or cyclic hydrocarbon group having one or more carbon-carbon triple bonds and having an alkynyl carbon chain length of $C_2$ to $C_{25}$. Representative alkynyl groups, include but are not limited to, ethynyl, 1-propynyl, 2-propynyl, 1-butynyl, 2-butynyl, pentynyl, heptynyl, octynyl, nonynyl, decynyl, undecynyl, dodecynyl, tridecynyl, tetradecynyl, pentadecynyl, hexadecynyl, heptadecynyl, octadecynyl, nonadecynyl, isocynyl, and the like.

As used herein, recitations of "linear or branched" groups, such as linear or branched alkyl, will be understood to include a methylene group, groups that are linear, such as linear $C_2$-$C_{25}$ alkyl groups, and groups that are appropriately branched, such as branched $C_3$-$C_{25}$ alkyl groups.

The features that characterize embodiments of the present invention are pointed out with particularity in the claims, which form a part of this disclosure. These and other features of such embodiments, their operating advantages and uses will be more fully understood from the description of such embodiments herein below.

Embodiments in accordance with the present invention provide sacrificial polymer compositions that encompass, among other things, the aforementioned sacrificial polymer, a thermally activated base generator moiety and a solvent. With regard to the sacrificial polymer, these polymers encompass both commercially available polyalkylene carbonates (e.g. polyethylene carbonate and polypropylene carbonate from Novomer, Inc. of Waltham Mass., and polyethylene carbonate, polypropylene carbonate, polybutylene carbonate, polycyclohexylene carbonate and a polybutylene carbonate/polycyclohexylene carbonate blend from Empower Materials, Inc., of New Castle, Del.), as well as polymers derived from polycyclic 2,3-diol monomers in accordance with any of Formulae A-G, A1-F1 and D1a-F1a shown below. Such polymers referred to as polynorbornanediol carbonates.

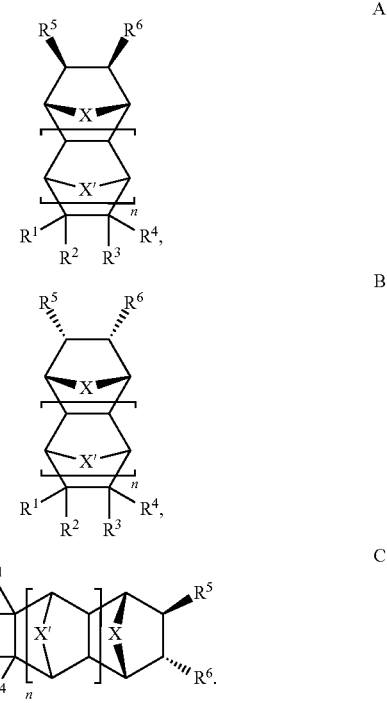

For each monomer represented by Formulae A, B and C, n is independently 0, 1 or 2, each of $R^1$, $R^2$, $R^3$ and $R^4$ is independently selected from hydrogen or a hydrocarbyl group containing, without limitation, from 1 to 25 carbon atoms, each of $R^5$ and $R^6$ are independently selected from —$(CH_2)_p$—OH, where p is 0, 1, 2 or 3, and each of X and X' is independently selected from —$CH_2$—, —$CH_2$—$CH_2$— and —O—, where each X' is, if present, oriented the same or opposite the orientation of X. For some embodiments in accordance with the present invention, p is 1, 2 or 3 for at least one of $R^5$ and $R^6$. In some embodiments of the present invention, the sum of the p for $R^5$ and p for $R^6$ is either 1 or 3.

As shown in Formulae A, B and C, each X group is depicted as extending upward out of the page. With Formula A, $R^5$ and $R^6$ are each also depicted as extending upward out of the page, and as such are cis- to one another and are exo-relative to the X group. Formula A, therefore is referred to as a polycyclic cis-exo 2,3-diol monomer. In Formula B, $R^5$ and $R^6$ are each depicted as extending downward into the page, and as such are cis- to one another and are endo-relative to the X group. Formula B, therefore, is referred to as a polycyclic cis-endo 2,3-diol monomer. For Formula C, $R^5$ is depicted as extending upward out of the page and is exo-relative to the X group, $R^6$ is depicted as extending downward into the page and is therefore endo-relative to the X group; additionally, $R^5$ and $R^6$ are trans-relative to one another. Formula C, therefore, is referred to as a polycyclic endo/exo 2,3-diol monomer or a polycyclic trans 2,3-diol monomer.

Some of the polynorbornanediol carbonate embodiments as described above can encompass repeating units derived from polycyclic 2,3-diols selected from each of Formulae A, B and C or selected from any one or two of such formulae.

When such a polynorbornanediol carbonate embodiment encompasses repeating units derived from two polycyclic 2,3-diol monomers represented by and selected from Formulae A, B and C, such embodiments will be understood to include mole percent ratios where any single mole percent is 1 and where any other single mole percent is 99. For example, the mole percent ratio of such repeating units include, but are not limited to 1 to 99, 10 to 90, 30 to 70, or any other subratio subsumed therein provided that the sum of the mole percents of such repeating units is 100 mole percent.

Some of the polynorbornanediol carbonate embodiments of the present invention encompass monomers represented by and selected from each of Formula A, Formula B and Formula C. Such embodiments will be understood to include mole percent ratios where any single mole percent is 1 and where any other single mole percent is 98. For example, such mole percent ratios including, but not limited to 1 to 1 to 98, 10 to 10 to 80, and 33.33 to 33.33 to 33.33, or any other subratio subsumed therein, provided that the sum of the mole percents is 100 mole percent.

Therefore, it will be understood that the polynorbornanediol carbonate embodiments in accordance with the present invention can encompass repeating units of any one, two or three of the above described monomers represented by Formulae A, B and C. Further, it will be understood that $R^5$ and $R^6$ can be independently selected from —$(CH_2)_p$—OH, where p is 0, 1, 2 or 3. In some embodiments of the present invention, the sum of the p for $R^5$ and p for $R^6$ is either 1 or 3.

Still further, it will be understood that for any of the aforementioned polynorbornanediol carbonate embodiments of the present invention, at least one of $R^1$-$R^4$ of any one or more repeat units encompassed therein is a group independently selected from alkyl, cycloalkyl, heteroalkyl, heterocycloalkyl, aryl, heteroaryl and aralkyl, and the others of $R^1$-$R^4$, if any, that are not selected from such non-hydrogen groups, are each hydrogen. Examples of alkyl, cycloalkyl, heteroalkyl, heterocycloalkyl, aryl, heteroaryl and aralkyl groups from which each of $R^1$-$R^4$ can be selected include, but are not limited to, those classes and examples as recited previously herein, which can optionally include one or more further substituents, such as, but not limited to: halohydrocarbyl substituents, such as but not limited to $C_1$-$C_{25}$ linear or branched perfluoro alkyl groups, such as but not limited to, —$CF_3$; carboxylic acid esters, such as but not limited to —COOR', where R' is a hydrocarbyl group; and ether groups, such as but not limited to —OR", where R" is a hydrocarbyl group.

Further still, it will be understood that in some polynorbornanediol carbonate embodiments in accordance with the present invention repeating units are derived from the monomers represented by Formulae A, B and C, where n is 0; X is methylene; three of $R^1$-$R^4$, are each hydrogen; and one of $R^1$-$R^4$ is both independently selected from an alkyl, cycloalkyl, heteroalkyl, heterocycloalkyl, aryl, heteroaryl or aralkyl group, and oriented exo relative to X. For purposes of illustration, such monomers can be represented by the following Formulae A1, B1 and C1.

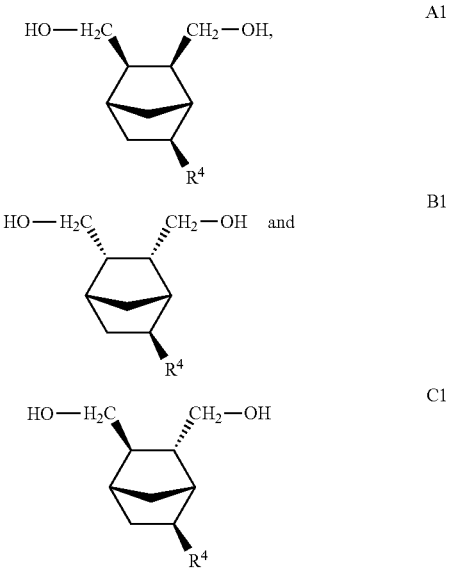

Additionally, some polynorbornanediol carbonate embodiments in accordance with the present invention, encompasses repeat units derived from: (a) polycyclic 2,3-diol monomers represented by one or more of Formulae A, A1, B, B1, C and/or C1; and (b) one or more further diol monomers that are other than polycyclic 2,3-diol monomers represented by Formulae A, A1, B, B1, C and/or C1. Such further diol monomers, as will be described further herein, include, but are not limited to: (i) polycyclic diol monomers represented by at least one of Formulae D, E, F and G; (ii) cyclic diol monomers represented by at least one of Formulae I-XII; (iii) polycyclic diol monomers represented by at least one of Formulae XIIa-XIIc; (iv) further optional diol monomers, such as hydrocarbyls having two or more hydroxyl groups; and combinations thereof.

Polynorbornanediol carbonate embodiments according to the present invention, encompass at least one repeat units derived from one or more of the polycyclic 2,3-diol monomers (a) represented by Formulae A-G, A1-F1 and D1a-F1a disclosed above and below. Additionally such polynorbornanediol carbonates can encompass one or more other diols (b) such as those represented by Formulae I-XIIc, disclosed below. Any one of the repeat units of such polycarbonates can be present in an amount of from 1 to 99 mole percent, or 5 to 95 mole percent, or 10 to 90 mole percent. The mole percents in each case being based on the total moles of repeating units derived from polycyclic 2,3-diol monomers (a), and other diols (b), provided that the sum of mole percents of repeating units is 100 mole percent.

Such other diols (b) can be used for purposes of modifying the physical properties of the resulting polycarbonate polymer. For example, such other diols (b) can provide the resulting polycarbonate polymer with weak links, that render the polycarbonate polymer more susceptible to depolymerization in the presence of an appropriate acid or base. Alternatively, or in addition to providing weak links, such other diols (b) can modify the $T_g$ and/or the solubility of the resulting polycarbonate polymer.

Some polymer embodiments of the present invention include repeat units derived from polycyclic diol monomers represented by the following Formulae D, E and F.

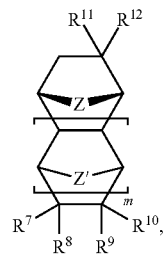

D

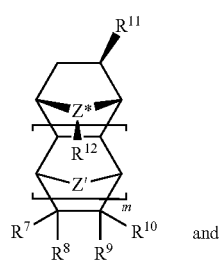

E and

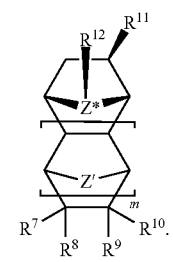

F

Independently for each further polycyclic diol monomer represented by Formulae D, E and F: m is 0, 1 or 2; Z and Z' are each independently selected from —CH$_2$—, —CH$_2$—CH$_2$— and —O—; Z' is —CH—; R$^7$, R$^8$, R$^9$ and R$^{10}$ are in each case independently selected from hydrogen, and a hydrocarbyl group; R$^{11}$ and R$^{12}$ are in each case independently selected from —(CH$_2$)$_p$—OH, where p for R$^{11}$ and R$^{12}$ is in each case independently selected from 0, 1, 2 or 3; and each Z', if present, oriented the same or opposite the orientation of Z or Z*, respectively.

With Formulae D, E and F, each Z group and Z* group is depicted as extending upward out of the page. With Formula D, each Z', if present, has an orientation, independently for each m, that is the same or opposite relative to the orientation of Z. With Formulae E and F, each Z', if present, has an orientation, independently for each m, that is the same or opposite relative to the orientation of Z*.

The hydrocarbyl groups from which R$^7$-R$^{10}$ can each be independently selected include, but are not limited to, those classes and examples recited previously herein. For each of Formulae D-F, in embodiments of the present invention, at least one of R$^7$-R$^{10}$ is a group independently selected from an alkyl, cycloalkyl, heteroalkyl, heterocycloalkyl, aryl, heteroaryl and aralkyl group, and the other R$^7$-R$^{10}$ group(s), if any, that are not selected from such non-hydrogen groups, are each hydrogen. Examples of alkyl, cycloalkyl, heteroalkyl, heterocycloalkyl, aryl, heteroaryl and aralkyl groups from which each of R$^7$-R$^{10}$ can be selected include, but are not limited to, those classes and examples as recited previously herein with regard to R$^1$-R$^4$.

In further embodiments, for each of Formulae D-F: m is 0; three of R$^7$-R$^{10}$ are each hydrogen; and one of R$^7$-R$^{10}$ is independently selected from alkyl, cycloalkyl, heteroalkyl, heterocycloalkyl, aryl, heteroaryl and aralkyl, and is oriented exo relative to Z or Z*. For purposes of illustration, with m=0, Z being —CH$_2$—, R$^7$, R$^8$ and R$^9$ each being hydrogen, R$^{10}$ being a non-hydrogen exo group, R$^{11}$ and R$^{12}$ each being —CH$_2$OH for Formula D and —OH for Formulae E and F, Formulae D-F can be represented by the following Formulae D1, E1 and F1. For purposes of further illustration, with m=0, Z being —CH$_2$—, R$^8$, R$^9$ and R$^{10}$ each being hydrogen, R$^7$ being a non-hydrogen exo group, R$^{11}$ and R$^{12}$ each being —CH$_2$OH for Formula D and —OH for Formulae E and F, Formulae D-F can be represented by the following Formulae D1a, E1a and F1a. It will be understood, that unless specifically stated, all Formulae presented herein are inclusive of the enantiomeric, and diastereomeric analogs thereof.

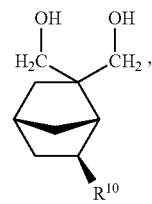

D1

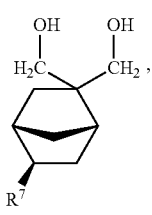

D1a

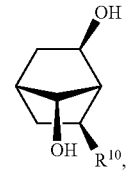

E1

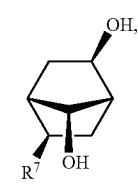

E1a

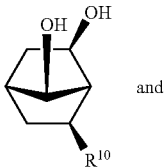

and

F1

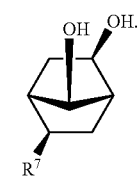

F1a

It should be noted that that Formulae D, D1 and D1a represent spiro diol monomers in that each —(CH$_2$)$_p$—OH or —CH$_2$—OH group is covalently bonded to the same carbon of the polycyclic structure.

Some other polymer embodiments in accordance with the present invention include repeat units derived from polycyclic diol monomers represented by the following Formula G.

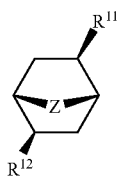

G

With the polycyclic diol represented by Formula G, Z, R$^{11}$ and R$^{12}$ are each as described previously herein with regard to Formulae D-F.

Still other embodiments in accordance with the present invention can also include polymers formed from cyclic and acyclic diol monomers represented by the following Formulae I through XII.

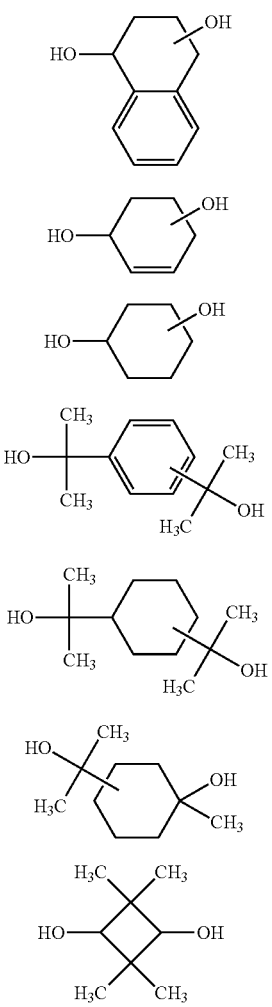

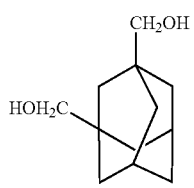

VIII

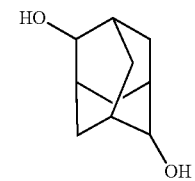

IX

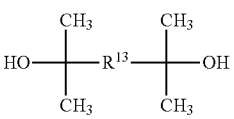

X

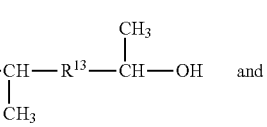

XI

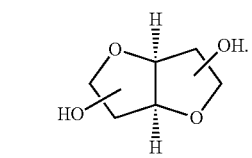

XII

For Formulae X and XI, R$^{13}$ is independently selected from C$_1$-C$_6$ alkyl, such as but not limited to methyl, ethyl and C$_3$-C$_6$ linear alkyl or C$_3$-C$_6$ branched alkyl.

Additional polymer embodiments of the present invention include repeat units derived from the polycyclic monomers represented by Formulae XIIa, XIIb and XIIc.

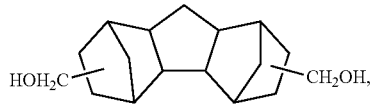

XIIa

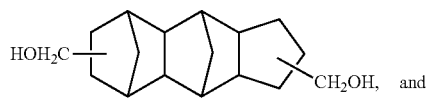

XIIb

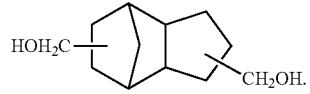

XIIc

Still further polyol monomers useful for embodiments in accordance with the present invention include, but are not limited to, hydrocarbyls having two or more hydroxyl groups, such as but not limited to 2, 3 or 4 hydroxyl groups. Examples of such further diol monomers include, but are not limited to: methyl, ethyl, C$_3$-C$_{25}$ linear or branched alkylene diols, such as, 1,2-ethylenediol, 1,3-propylenediol and 1,2-propylenediol; and polyalkyleneglycols, such as di-, tri-, tetra- and higher ethyleneglycols, di-, tri, tetra- and higher propyleneglycols, and polytetrahydrofuran. Optional polyol monomers having more than two hydroxyl groups are typically present in small amounts, such as but not limited to less than 10 mole percent, or less than 5 mole percent, based on the total mole percent of hydroxyl functional monomers. Examples of polyol monomers having more than two hydroxyl groups include, but are not limited to, trimethylolpropane, pentaerythritol and di-trimethylolpropane.

As previously mentioned, some embodiments in accordance with the present invention encompass commercially available alkylenecarbonate polymers (also referred to as polyalkylenecarbonates) that are not derived from polyol monomers represented by any of the aforementioned formulae. Rather, such commercially available alkylenecarbonate polymers are represented by Formula M, shown below:

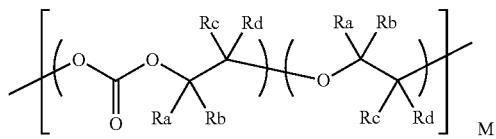

Where each $R_a$ is independently hydrogen or an optionally substituted group selected from the group consisting of a $C_1$ to $C_{30}$ aliphatic; $C_1$ to $C_{30}$ heteroaliphatic having 1-4 heteroatoms independently selected from the group consisting of nitrogen, oxygen, silicon and/or sulfur; 6- to 10-membered aryl; 5- to 10-membered heteroaryl having 1-4 heteroatoms independently selected from nitrogen, oxygen, silicon and/or sulfur; and 3- to 7-membered heterocyclic having 1-3 heteroatoms independently selected from nitrogen, oxygen, silicon and/or sulfur; and each of $R_b$, $R_c$ and $R_d$ is independently hydrogen or an optionally substituted group selected from the group consisting of $C_1$ to $C_{12}$ aliphatic; $C_1$ to $C_{12}$ heteroaliphatic having 1-4 heteroatoms independently selected from the group consisting of nitrogen, oxygen, silicon and/or sulfur; 6- to 10-membered aryl; 5- to 10-membered heteroaryl having 1-4 heteroatoms independently selected from nitrogen, oxygen, silicon and/or sulfur; and 3- to 7-membered heterocyclic having 1-3 heteroatoms independently selected from the group consisting of nitrogen, oxygen, silicon and/or sulfur; where any of ($R_a$ and $R_c$) ($R_c$ and $R_d$) and ($R_a$ and $R_b$) can be taken together with intervening atoms to form one or more optionally substituted rings that can optionally contain one or more heteroatoms.

For non-limiting, illustrative purposes only, Synthetic Schemes 1-7 are provided to demonstrate art-recognized methods for preparing the various polycyclic 2,3-diol monomers discussed above. Thus the polycyclic cis-exo 2,3-diol monomer represented by Formula A can be prepared in accordance with the following Synthetic Scheme 1, in which n is 0, $R^1$-$R^4$ are each hydrogen, X is —$CH_2$—, and $R^5$ and $R^6$ are each —$CH_2OH$.

Synthetic Scheme 1

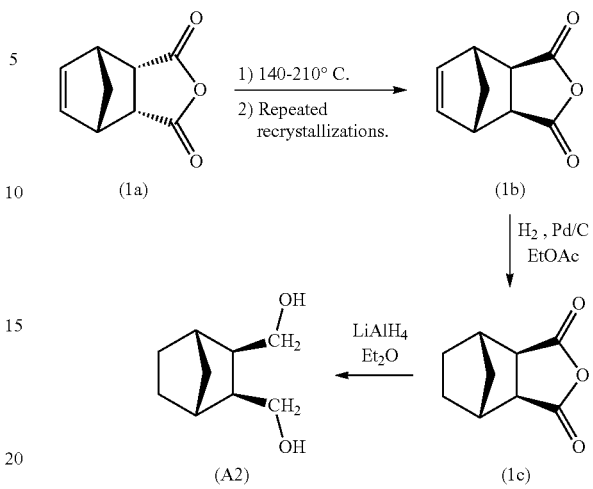

With reference to Synthetic Scheme 1, endo-2,3-norbornene dicarboxylic acid anhydride (also referred to as endo-nadic anhydride) (1a) is exposed to a temperature of 140 to 210° C. for a sufficient period of time, such as from 15 minutes after melting to 24 hours, followed by repeated recrystallizations, such as 2 or more recrystallizations from ethyl acetate or toluene, so as to form 5-norbornene-cis-exo-2,3-dicarboxylic acid anhydride (also referred to as exo-nadic anhydride) (1b). Hydrogenation of exo-nadic anhydride (1b) in the presence of hydrogen gas ($H_2$), palladium catalyst supported on porous carbon (Pd/C), and ethyl acetate (EtOAc), results in formation of exo-2,3-norbornane dicarboxylic acid anhydride (1c). Reduction of exo-2,3-norbornane dicarboxylic acid anhydride (1c) in the presence of lithium aluminum hydride ($LiAlH_4$) and ethyl ether ($Et_2O$) results in formation of cis-exo-2,3-norbornanedimethanol (A2).

The polycyclic cis-endo 2,3-diol monomer represented by Formula B can be prepared in accordance with the following Synthetic Scheme 2, in which n is 0, $R^1$-$R^4$ are each hydrogen, X is —$CH_2$—, and $R^5$ and $R^6$ are each —$CH_2OH$.

Synthetic Scheme 2

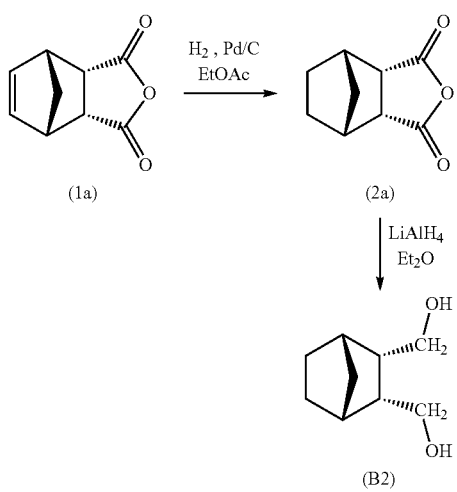

With reference to Synthetic Scheme 2, 5-norbornene-cis-endo-2,3-dicarboxylic acid anhydride (also referred to as endo-nadic anhydride) (1a) is hydrogenated in the presence of hydrogen gas ($H_2$), palladium catalyst supported on porous carbon (Pd/C), and ethyl acetate (EtOAc), results in formation of endo-2,3-norbornane dicarboxylic acid anhydride (2a). Reduction of endo-2,3-norbornane dicarboxylic acid anhydride (2a) in the presence of lithium aluminum hydride ($LiAlH_4$) and ethyl ether ($Et_2O$) results in formation of cis-endo-2,3-norbornanedimethanol (B2).

The polycyclic trans-endo-exo-2,3-diol monomer represented by Formula C can be prepared in accordance with the following Synthetic Scheme 3, which is provided for purposes of non-limiting illustration, in which n is 0, $R^1$-$R^4$ are each hydrogen, X is —$CH_2$—, and $R^5$ and $R^6$ are each —$CH_2OH$.

Synthetic Scheme 3

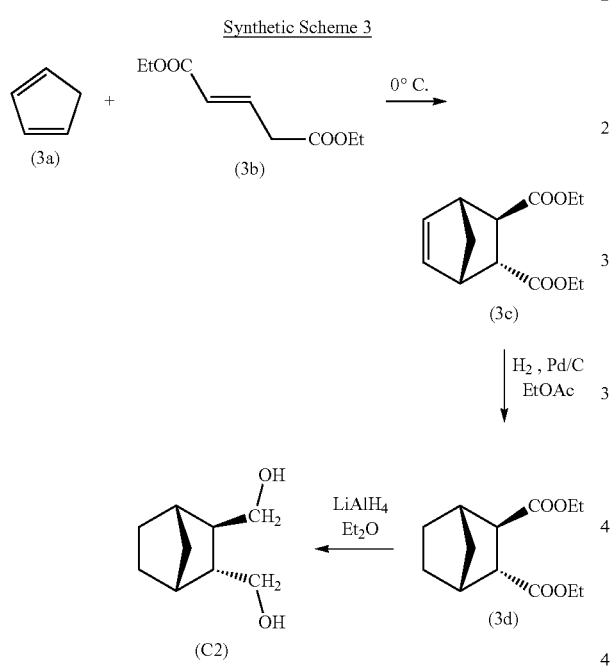

With reference to Synthetic Scheme 3, cyclopentadiene (3a) and diethyl fumarate (3b) are reacted together by means of Diels-Alder reaction at reduced temperature, such as 0° C., so as to form trans-endo-exo-2,3-norbornene bis(ethylcarboxylate) (3c). Hydrogenation of trans-endo-exo-2,3-norbornene bis(ethylcarboxylate) (3c) in the presence of hydrogen gas ($H_2$), palladium catalyst on porous carbon (Pd/C), and ethyl acetate (EtOAc), results in formation of trans-endo-exo-2,3-norbornane bis(ethylcarboxylate) (3d). Reduction of trans-endo-exo-2,3-norbornane bis(ethylcarboxylate) (3d) in the presence of lithium aluminum hydride ($LiAlH_4$) and ethyl ether ($Et_2O$) results in formation of trans-exo-endo-2,3-norbornanedimethanol (C2).

The polycyclic cis-exo-2,3-diol monomer represented by Formula A can be prepared in accordance with the following Synthetic Scheme 4, which is provided for purposes of non-limiting illustration, in which n is 0, $R^1$-$R^4$ are each hydrogen, X is —$CH_2$—, $R^5$ is —OH and $R^6$ is —$CH_2OH$.

Synthetic Scheme 4

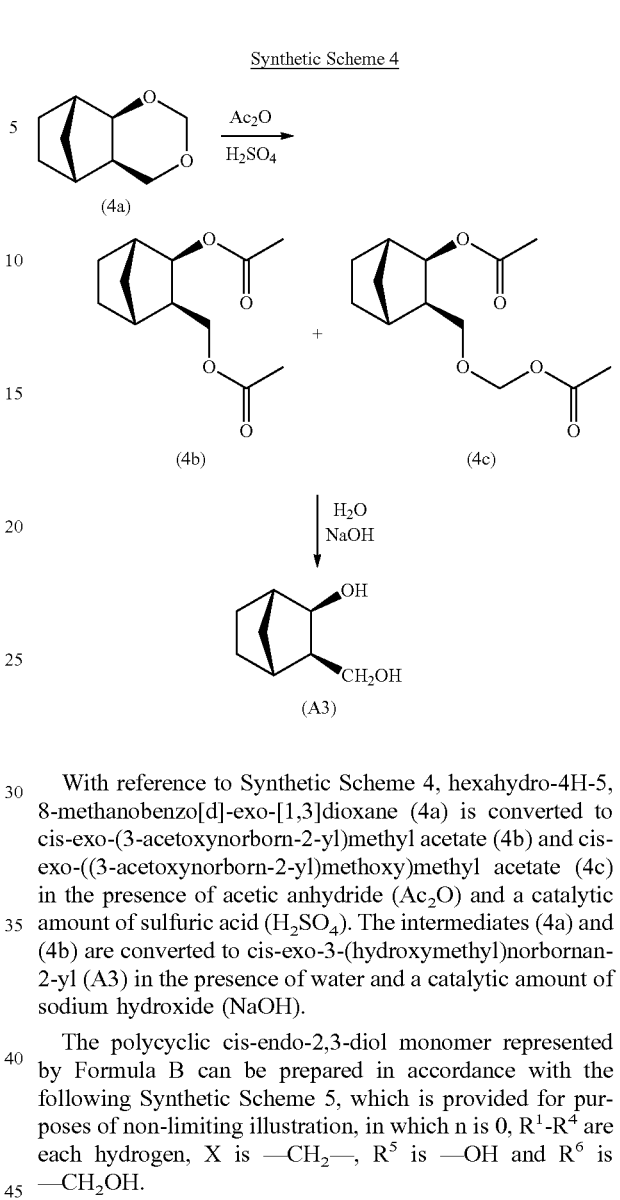

With reference to Synthetic Scheme 4, hexahydro-4H-5,8-methanobenzo[d]-exo-[1,3]dioxane (4a) is converted to cis-exo-(3-acetoxynorborn-2-yl)methyl acetate (4b) and cis-exo-((3-acetoxynorborn-2-yl)methoxy)methyl acetate (4c) in the presence of acetic anhydride ($Ac_2O$) and a catalytic amount of sulfuric acid ($H_2SO_4$). The intermediates (4a) and (4b) are converted to cis-exo-3-(hydroxymethyl)norbornan-2-yl (A3) in the presence of water and a catalytic amount of sodium hydroxide (NaOH).

The polycyclic cis-endo-2,3-diol monomer represented by Formula B can be prepared in accordance with the following Synthetic Scheme 5, which is provided for purposes of non-limiting illustration, in which n is 0, $R^1$-$R^4$ are each hydrogen, X is —$CH_2$—, $R^5$ is —OH and $R^6$ is —$CH_2OH$.

Synthetic Scheme 5

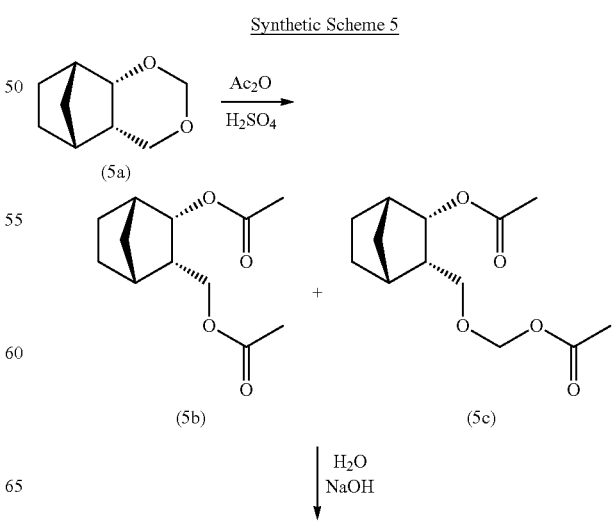

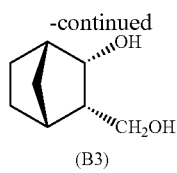

(B3)

With reference to Synthetic Scheme 5, hexahydro-4H-5,8-methanobenzo[d]-endo-[1,3]dioxane (5a) is converted to cis-endo-(3-acetoxynorborn-2yl)methyl acetate (5b) and cis-endo-((3-acetoxynorborn-2-yl)methoxy)methyl acetate (5c) in the presence of acetic anhydride ($Ac_2O$) and a catalytic amount of sulfuric acid ($H_2SO_4$). The intermediates (5a) and (5b) are converted to cis-endo-3-(hydroxymethyl) norbornan-2-yl (B3) in the presence of water and a catalytic amount of sodium hydroxide (NaOH).

The optional polycyclic diols represented by Formulae D, E, F and G can be prepared by art-recognized methods. For purposes of non-limiting illustration, the optional polycyclic diol represented by Formula F can be synthesized in accordance with the following Synthetic Scheme 6, where m is 0, $R^7$-$R^{10}$ are each hydrogen, Z is —$CH_2$—, $R^{11}$ is —OH and $R^{12}$ is —$CH_2OH$.

Synthetic Scheme 6

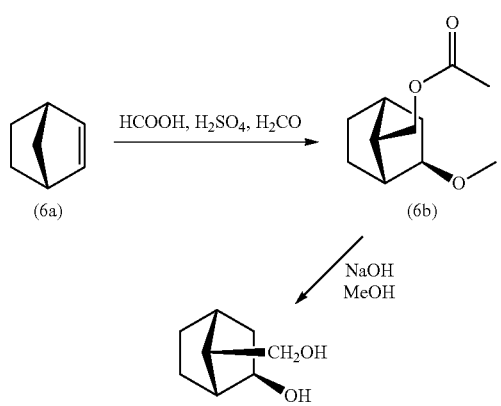

With reference to Synthetic Scheme 6, 2,3-norbornene (6a) is converted to (2-(formyloxy)norborn-7-yl)-exo-methyl formate (6b) in the presence of formic acid (HCOOH) sulfuric acid ($H_2SO_4$) and formaldehyde ($H_2CO$). Intermediate (6b) is then converted to 7-(hydroxymethyl) norbornan-2-exo-ol (F1) in the presence of sodium hydroxide (NaOH) and methanol (MeOH).

Alkylenecarbonate polymer embodiments according to the present invention can also be prepared by art-recognized methods. For example, the alkylenecarbonate polymers according to embodiments of the present invention can be prepared by a carbonyl halide route, in which one or more polycyclic 2,3-diol monomers are reacted with a carbonyl halide, $X_2C$=O, in which each X is selected independently from a halo group. An example of a carbonyl halide includes, but is not limited to, phosgene, where each X is chloro (Cl). Alternatively, a carbonyl diimidazole route can be used, in which one or more polycyclic 2,3-diol monomers are reacted with N,N-carbonyldiimidazole.

Typically, polymer embodiments prepared from the aforementioned diol monomers are polymerized via a carbonate route in which one or more polycyclic 2,3-diol monomers are reacted with a dialkyl carbonate, such as diethyl carbonate, a diaryl carbonate, such as diphenyl carbonate, and/or an alkyl-aryl carbonate. For purposes of non-limiting illustration of embodiments in accordance with the present invention, a polycarbonate polymer can be prepared in accordance with the following Synthetic Scheme 7.

Synthetic Scheme 7

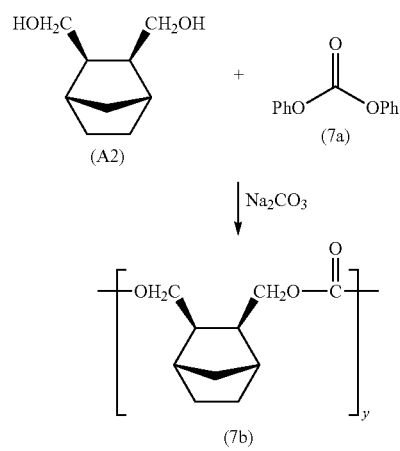

With reference to Synthetic Scheme 7, cis-exo-2,3-norbornanedimethanol monomer (A2) is reacted with diphenyl carbonate (7a) in the presence of sodium carbonate, which results in formation of poly(cis-exo-2,3-norbornane dimethyl carbonate) (7b), in which y is the number of repeat units. The cis-exo-2,3-norbornanedimethanol monomer (A2), is a polycyclic 2,3-diol monomer according to Formula A, in which n is 0, $R^1$-$R^4$ are each hydrogen, X is —$CH_2$—, and $R^5$ and $R^6$ are each —$CH_2OH$.

For polycarbonate polymer embodiments according to the present invention, the polycarbonates can be selected from homopolymers, such as homopolymers containing a single type of repeating unit derived from one of Formulae A, B or C, or random copolymers, or block copolymers, or alternating copolymers, which are alternatively referred to herein as random polymers, block polymers and alternating polymers. The random, block and alternating polycarbonate copolymer embodiments according to the present invention can include two or more types of repeating units derived from at least one of Formulae A, B or C.

For some embodiments according to the present invention, the polycarbonates can have a wide range of molecular weights. For example, such polymers can have weight average molecular weight ($M_w$) values of from 2000 to 250,000, or from 8000 to 150,000, or from 9000 to 80,000; and polydispersity index (PDI) values ($M_w/M_n$) of greater than 1.0 and less than or equal to 4.0, such as, but without limitation, from 1.1 to 4.0, or from 1.2 to 2.0, or from 1.3 to 1.8.

For some embodiments according to the present invention, the polycarbonates can have a wide range of glass transition temperature ($T_g$) values, such as but not limited to, Tg values of from −50° C. to 200° C., or from 25° C. to 180° C., or from 60° C. to 175° C.

For some embodiments according to the present invention, the polycarbonates can be characterized with regard to the temperature at which the polymer decomposes, which can also be referred to as a decomposition temperature. For some embodiments, the decomposition temperature of the polycarbonates can be quantified with regard to their half-decomposition temperature ($T_{d50}$), which is the temperature at which a 50 percent weight loss is observed. Half-decomposition temperatures are typically determined by means of thermogravimetric analysis (TGA). Half-decomposition temperatures can be determined for the polymer alone and for the polymer in the presence of additives, e.g., a thermally activated base generator after its activation.

Embodiments in accordance with the present invention also provide sacrificial polymer compositions that encompass: a single type of polycarbonate having one or more types of carbonate repeat units as described previously herein and a thermally activated base generator. The sacrificial polymer composition embodiments according to the present invention, can also encompass a single type of polycarbonate or a blend or mixture of two or more types of polycarbonates.

For embodiments of the present invention, where the sacrificial polymer composition encompasses a single polycarbonate, such polymer can encompass any of the previously mentioned polyalkylenecarbonates or be derived from polycyclic 2,3-diol monomers as described above and below. Where such polymer composition embodiments encompass two or more types of polymers, each of such polymers can be two or more distinct polyalkylenecarbonates or two or more polymers derived from distinct polycyclic 2,3-diol monomers. Thus the sacrificial polymer composition embodiments in accordance with the present invention can encompass just a first polycarbonate having repeating units derived from polycyclic 2,3-diol monomers represented by one or both of Formulae A and B; or a combination of such first polycarbonate and a second polycarbonate having repeating units derived from polycyclic 2,3-diol monomers represented by Formula C. Additionally, such sacrifical polymer embodiments can encompass one or more of the aforementioned commercially available polyalkylene carbonates.

The thermally activated base generator used in the sacrificial composition embodiments in accordance with the present invention, generates a base upon heating to an effective temperature, where the generated base causes depolymerization of the sacrificial polymer. As used herein, the term "depolymerization" will be understood to mean that the sacrificial polymer is at least partially broken down into smaller units each having a molecular weight less than the molecular weight of the polymer prior to depolymerization. Such depolymerized units include, but are not limited to: the monomers from which the polymer was derived; polycarbonate oligomers; hydroxyl-terminated polycyclic carbonate oligomers; polycyclic carbonates; polycyclic ethers; cyclic carbonates, CO and/or $CO_2$.

For purposes of nonlimiting illustration, the depolymerization of a polycarbonate or polycarbonate segment derived from a polycyclic 2,3-diol represented by Formula A, in which n is 0, X is —$CH_2$—, and $R_1$-$R_4$ are each hydrogen, so as to form polycyclic carbonates containing at least one carbonate linkage in the polycyclic ring, and/or polycyclic ethers containing at least one ether linkage in the polycyclic ring, and the depolymerization of a commercially available polypropylene carbonate are represented by the following Schemes 8a and 8b.

Scheme 8a

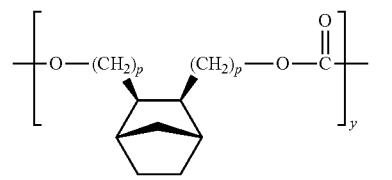

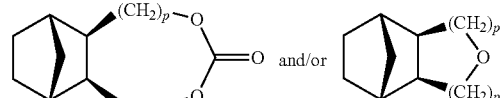

Scheme 8b

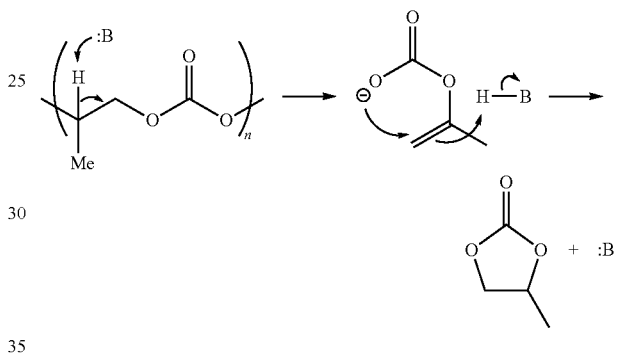

The polycyclic carbonates and/or polycyclic ethers depicted in Schemes 8a and 8b are vaporized by concurrent or subsequent application of elevated temperature. For some embodiments of the present invention, the moieties created by the depolymerization, such as polycyclic carbonates and/or polycyclic ethers, permeate through an overcoat layer, as will be described in further detail herein.

For some embodiments of the present invention, the polycarbonate polymer can encompass one or more monomer units derived from polycyclic diol monomer D. At least partial depolymerization of such polycarbonate polymers in the presence of a base, activated with an elevated temperature, can result in the formation of one or more polycyclic carbonate and/or polycyclic ether depolymerization units represented by the following Formulae D-DU1 and D-DU2, respectively.

D-DU1

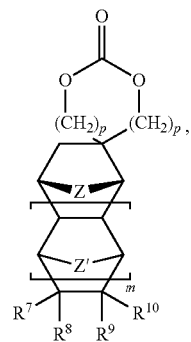

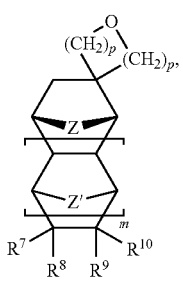

D-DU2

With some embodiments, for each of Formulae D-DU1 and D-DU2, at least one p is at least 1. Vaporized depolymerization units represented by Formulae D-DU1 and D-DU2 can permeate through an overcoat layer, as will be described in further detail herein.

The thermally activated base generators (TABG), described below, are encompassed in polymer composition embodiments of the present invention. Such TABGs include, but are not limited to, bases encompassing cations represented by any of Formulae 1, 2 or 3:

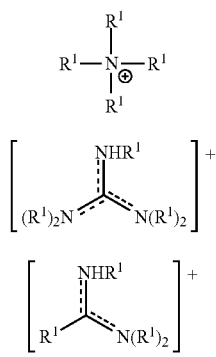

where each $R^1$ is independently selected from hydrogen, a methyl or ethyl group, a linear, branched or cyclic $C_3$-$C_{12}$ alkyl group; a linear, branched or cyclic $C_3$-$C_{12}$ heteroalkyl group having from 1 to 4 heteroatoms independently selected from nitrogen, oxygen or sulfur; a $C_6$-$C_{10}$ aryl group; a $C_5$-$C_{10}$ heteroaryl group having from 1 to 4 heteroatoms independently selected from nitrogen, oxygen or sulfur; or where two $R^1$ groups are taken together with any intervening atoms to form one or more cyclic alkyl or heteroalkyl groups as previously defined, and where for Formula 1, at least one $R^1$ is hydrogen. Exemplary tetraalkyl bases include, among others, tetra-ethyl amine ($Et_4N^+$) and tetra-butyl amine ($Bu_4N^+$).

The former being available as an acetate salt from Aldrich Specialty Chemicals as Catalog Number 205583 Aldrich and from Fluka as Catalog Number 96607. The latter also being available from either Aldrich or Fluka as Catalog Numbers 335991 and 86835, respectively. As will be seen in the Examples, a proprietary amidine salt, CXC-1761, available from King Industries, was also evaluated as a TABG.

The thermally activated base generators in accordance with the present invention are salts generally having a carboxylate anion. Such salts being characterized by releasing a free base when heated to an effective activation temperature, the free base then having sufficient basicity to cause depolymerization as shown in Scheme 8b. Referring now to Table A (derived from the Thesis of Xun Sun, entitled "Development of tetraphenylborate-based Photobase generators and sacrificial Polycarbonates for radiation curing and Photoresist applications"; Carleton University, Ottawa, Ontario, November 2008), below, the basicity of the released free bases 1, 8-diazabicyclo[5.4.0]undec-7-ene (DBU), 1,5,7-triazabicyclo[4.4.0]dec-5-ene (TBD), expressed as $pK_a$ measured in acetonitrile, are at least 24.34 and both exhibit significant reduction of the decomposition temperature ($T_d$) of a polypropylene carbonate. In contrast, the tertiary amines (TEA) and phenylhydrazine ($PhNHNH_2$), with $pK_a$ 12.33 or less, exhibited only a small reduction in $T_d$. Thus this reduction in PPC decomposition temperature is a measure of both basicity and the effectiveness of a specific TABG and can be employed to screen potential TABGs.

TABLE A

| Bases | $pK_a$ | $\Delta T_d$ | Residuals (wt %) |
|---|---|---|---|
| TBD | 25.03 | 175 | 0.3 |
| DBU | 24.34 | 80 | 0.7 |
| TEA | 18.8 | 10 | 0.9 |
| $PhNHNH_2$ | 12.33 | 10 | 4.8 |

Based on the aforementioned $pK_a$ values, thermally generated bases useful for embodiments in accordance with the present invention encompass one or more of the following structures.

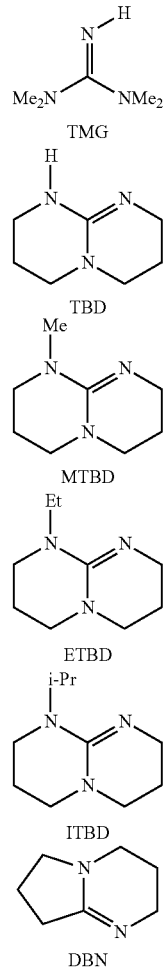

21
-continued
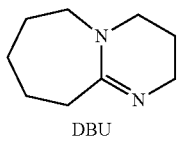
DBU
Representative structures of carboxylates, in their acid form, useful as the carboxylate anion of the TABG embodiments of the present invention are depicted below:
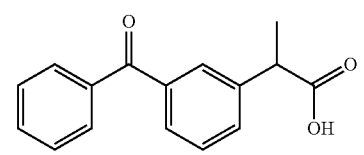
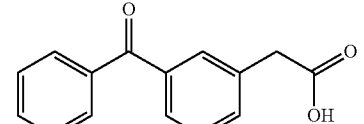
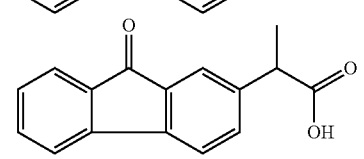
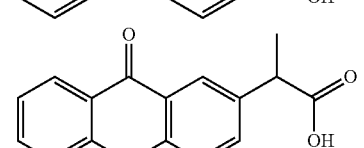
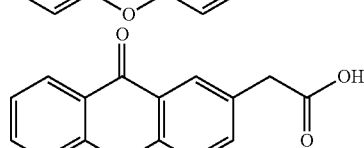
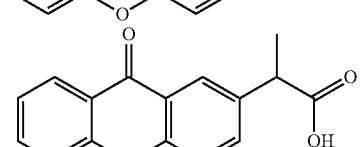
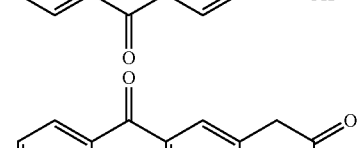
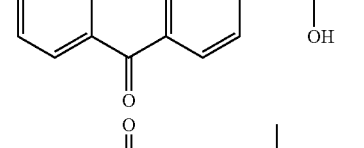
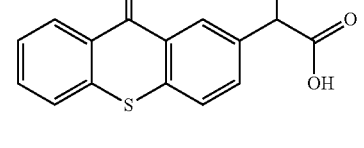
22
-continued
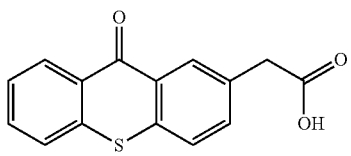
PT-407M
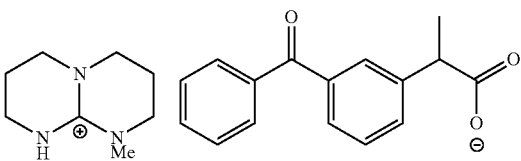
PT-407Mi
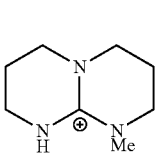
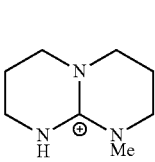
PT-393
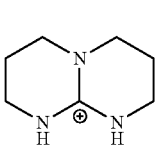
PT-393i
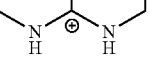
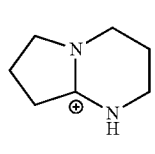
PT-378
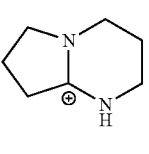
PT-378i
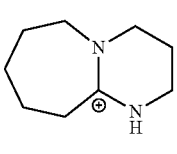
PT-407
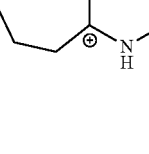

-continued

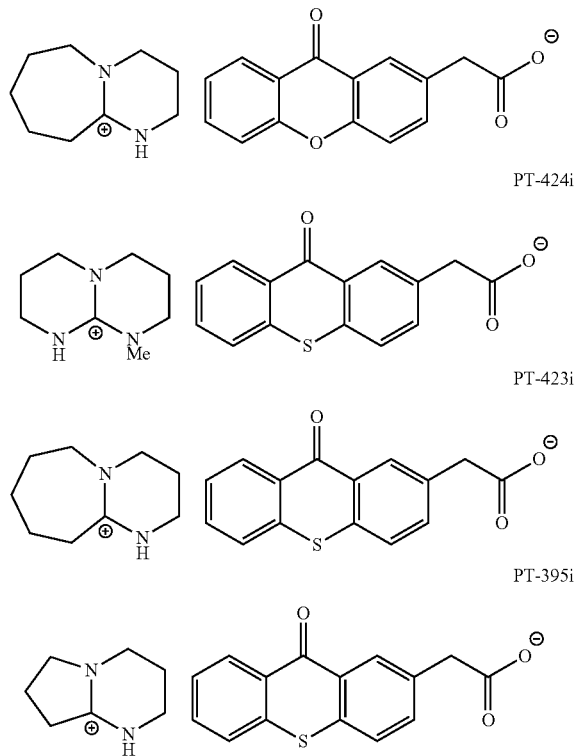

PT-407i

PT-424i

PT-423i

PT-395i

The amount of TABG useful in composition embodiments in accordance with the present invention is any amount that generates an effective amount of base to catalyze the depolymerization reaction, such amount can thus be referred to as an effective amount. For some embodiments, such amount is from 0.1 to 25 pphr inclusive, based on the weight of the polymer; in other embodiments from 0.5 to 15 pphr inclusive and in still other embodiments, from 1 to 12 pphr inclusive. It will be understood, that for some embodiments of the present invention, it can be advantageous to employ a mixture of TABGs were the effective amount of such mixture is inclusive of the ranges expressed above. Further, some polymer composition embodiments in accordance with the present invention encompass a mixture of a TABG and an effective amount of formic acid.

For some embodiments according to the present invention, the sacrificial polymer composition can further include one or more solvents. Solvent can be present in an amount of from, for example, 10 to 99 percent by weight, or 40 to 90 percent by weight, or 50 percent to 80 percent by weight, based on the total weight of the sacrificial polymer composition. Examples of solvents that can be included in the sacrificial polymer composition include, but are not limited to, acetonitrile, acetophenone, α-angelicalactone, anisole, γ-butyrolactone, n-butyl acetate, cyclohexylbenzene, cyclohexanone, cyclopentanone, decahydronaphthalene, diethylene glycol dimethyl ether, N,N-dimethylacetamide, N,N-dimethylformamide, ethyl 3-ethoxypropionate, ethyl lactate, 2-heptanone, methyl isobutyl ketone, mesitylene, 2-methoxyethyl ether, 1-methyl-2-pyrrolidinone, 2-methyltetrahydrofuran, methyl tetrahydrofurfuryl ether, γ-octanoic lactone, propylene carbonate, propylene glycol monomethyl ether acetate, propylene glycol monomethyl ether, 1,2,3,4-tetrahydronaphthalene, and combinations thereof.

As discussed previously herein with regard to polycarbonate embodiments of the present invention, sacrificial polymer composition embodiments according to the present invention can be characterized with regard to the temperature at which the composition decomposes or depolymerizes, which can be referred to as a decomposition temperature of the sacrificial polymer composition. The decomposition temperature of the sacrificial polymer composition can be quantified with regard to the $T_{d50}$ decomposition temperatures as described previously herein.

In further accordance with embodiments of the present invention, there is also provided methods of forming useful microelectronic or optoelectronic devices or structures that make use of the aforementioned sacrificial polymer composition embodiments of the present invention.

Referring first to the forming of such devices, some such device forming embodiments in accordance to the present invention encompass providing a first and a second substrate where each substrate has a surface that encompasses a plurality of first and second metal bumps or contact structures, respectively. It will be understood that each of the first and second substrates can be a microelectronic device such as a semiconductor chip or die so that a chip stack is formed, or that one of such substrates is a semiconductor chip and the other a substrate such as would be employed in forming a "flip-chip" assembly. Further, it will be understood that the aforementioned sacrificial polymer composition embodiments of the present invention is applied to one or both of the substrates and that such substrates are positioned and held to one another by the tack properties of such composition, where each of the aforementioned plurality of metal bumps, or structures, are appropriately aligned and held in such alignment by the tackiness of such sacrificial polymer composition such that electrical coupling can be subsequently made. Still further it will be understood that at least one of said first or second plurality of metal bumps encompasses solder such that upon heating the substrates and polymer composition to an effective temperature, the solder will reflow to provide the aforementioned electrical coupling while the polymer composition provides a fluxing property to enable or enhance such electrical solder coupling. Further still, it will be understood that the substrates and polymer composition will be held at such effective temperature for a time sufficient to complete the electrical coupling and to allow for the decomposition of the alkylenecarbonate polymer encompassed in the polymer composition. It should be noted, that where the plurality of first and second metal bumps, or structures, mentioned above, such characterization is non-limiting and that some embodiments of the present invention can be characterized as having a plurality of first and second metallic contacts (or contact regions), where at least one of such pluralities encompasses solder or another bondable material.

With respect to the method described above, the application of polymer composition embodiments can be accomplished by any suitable means. For example, printing, such as but not limited to, jet printing, which is similar to inkjet printing, or screen printing; dispensing, such as but not limited to, spot or line dispensing, spray coating, doctor blading or spin coating.

With regard to the aforementioned effective temperature, such temperature will vary, at least, as a function of the specific TABG employed. Additionally such temperature can be a function of the use of the polymer composition within which it is encompassed and the structure that is being formed. For example, where a "flip-chip" structure is being made, such effective temperature is generally consistent with the reflow temperature of the solder, or other bondable material, selected for the electrical coupling. Whereas when a three-dimensional structure is being made, such effective temperature is a temperature less than the decomposition temperature of the overcoat layer. Still further, the effective temperature is also a function of the depolymerization temperature of the alkylenecarbonate polymer embodiment selected and the temperature at which the depolymerization products are removed. Therefore, some forming embodiments in accordance with the present invention can encompass a first effective temperature to activate the base generator and a second effective temperature to facilitate the removal of depolymerization products. Further still, the period of time where heating to an effective temperature is maintained can also vary as a function of the structure being formed, three-dimensional structures typically requiring more time at the effective temperature than "flip-chip" type structures, as well as the amount of the polymer composition used for such structure or device forming method. Advantageously, for embodiments according to the present invention, both the aforementioned three-dimensional space and the area between the electrically coupled substrates is essentially free of residue of the sacrificial polymer composition.

While it will be seen in the Examples provided below, that the polymer composition embodiments in accordance with the present invention are effective tack and flux agents, such embodiments can also be employed for temporarily bonding a first substrate to a second substrate. Such bonding forming a multilayered structure that includes a first substrate, a second substrate, and a temporary bonding layer interposed between the first substrate and the second substrate. The temporary bonding layer, alternatively be referred to as a temporary adhesive layer, being formed from such a polymer composition embodiment. Further, it will be realized that such a multilayer structure is useful to provide a substrate surface for a process such as chemical mechanical polishing or the creation of through silicon vias (TSVs). When the TABG is activated, the sacrificial polymer is at least partially depolymerized allowing for the substrates to be debonded or separated from one another.

Still further, the polymer composition embodiments in accordance with the present invention can be used in or in conjunction with still other applications where either a temporary or permanent bond is useful. Such applications including, but not limited to, applications in the field of microelectronics, such as but not limited to, flip-chip structures, microprocessor chips, communication chips, and optoelectronic chips; and the fields of microfluidics; sensors; and analytical devices, such as but not limited to, microchromatographic devices.

The following examples are for illustrative purposes and are not intended to limit the scope of embodiments in accordance with the present invention in any way. It will be noted that the ratios of repeating units incorporated into the polymer backbones are given in molar weight percent.

EXAMPLES

Polynorbornanediol carbonates according to embodiments of the present invention were prepared in accordance with the synthetic procedures described in the following Examples 1-5. Properties of the carbonates formed in the manner of Examples 1-3 are summarized in Tables 1a and 1b, below. In these tables, $T_g$ values were determined by differential scanning calorimetry at a heating rate of 10° C./minute; the $T_{d5}$, $T_{d50}$ and $T_{d95}$ values were determined by thermogravimetric analysis at a heating rate of 10° C./minute, and indicate the temperatures at which 5 percent, 50 percent and 95 percent by weight of the polymer had decomposed; the chain-end phenyl group (End Ph) percent mole values indicate the theoretical amount of phenol, based on the initial amount of diphenyl carbonate raw material charged, that was not removed during polymerization; the mole percents were determined by $^1$H NMR analysis, and indicate the percent of monomer units in the polymers derived from the particular cis-exo- or cis-endo-2,3-norbornanedimethanol monomer, the remainder corresponds to the percent of monomer units in the copolymer derived from the other monomer: 41% cis-endo-2,3-norbornanedimethanol (Example 1); 59% 1,3-cyclohexanediol (Example 2); and 59% 1,3-cyclohexanediol (Example 3); solubility was determined by attempting to dissolve a target resin content (RC, 20 wt %) of the polymer in a process solvent, the designation "A" refers to anisole, and the designation "G" refers to γ-butyrolactone.

POLYCARBONATE POLYMER EXAMPLES

Example 1

The following were added to a suitably sized and outfitted multi-necked flask, including, for example, a thermocouple, heating mantle, mechanical stirrer, nitrogen sweep, and vacuum pump: 22.5 grams of cis-exo-2,3-norbornanedimethanol (144 millimoles or mmoles); 15.0 grams of cis-endo-2,3-norbornanedimethanol (96 mmoles); 51.3 grams of diphenyl carbonate (240 mmoles); and 12 milligrams (mg) of lithium hydride (1.5 mmoles). The contents of the flask were heated to and held at 120° C. under a nitrogen sweep for a period of time sufficient to convert the contents thereof to a liquid. The contents of the flask were then held at 120° C. for 2 hours with constant stirring and under a nitrogen sweep. The contents of the flask were then subjected to a reduced pressure of about 10 kPa, with constant stirring at 120° C. for 1 hour. The pressure within the flask was then further reduced to less than 0.5 kPa, and the contents subjected to continued stirring at 120° C. for 1.5 hours, followed by a 1.5 hour hold at 180° C.

The contents of the flask were cooled and dissolved in a suitable amount of tetrahydrofuran, such as 800 ml, and filtered. The filtered solution was then added to and precipitated from an appropriate amount, such as 8 liters, of a liquid including methanol and distilled water in a volume ratio 9 to 1. The precipitated polymer was washed with an appropriate amount, such as 4 liters, of wash liquid including methanol and distilled water in a volume ratio 9 to 1, and then dried. About 30.7 grams of polycarbonate copolymer were obtained in a yield of about 70 percent. The polycarbonate copolymer was determined by gel permeation chromatograph (GPC) to have a weight average molecular weight ($M_w$) of 41,000, and a polydispersity index (PDI) of 1.70.

Example 2

A polycarbonate copolymer according to embodiments of the present invention was prepared in accordance with the procedure described in Example 1 from the following: 20.5 grams of 1,3-cyclohexanediol (176 mmoles); 15.5 grams of cis-exo-2,3-norbornanedimethanol (99 mmoles); 56.6 grams of diphenyl carbonate (264 mmoles); and 13.2 mg of lithium hydride (1.7 mmoles). About 28.1 grams of polycarbonate copolymer were obtained in a yield of about 69 percent. The polycarbonate copolymer was determined by GPC to have a Mw of 47,000, and a PDI of 1.75.

Example 3

A polycarbonate copolymer according to embodiments of the present invention was prepared in accordance with the procedure described in Example 1 from the following: 19.2 grams of 1,3-cyclohexanediol (165 mmoles); 14.5 grams of cis-endo-2,3-norbornanedimethanol (93 mmoles); 53 grams of diphenyl carbonate (248 mmoles); and 10.1 mg of lithium hydride (1.3 mmoles). About 28.7 grams of polycarbonate copolymer were obtained in a yield of about 76 percent. The polycarbonate copolymer was determined by GPC to have a Mw of 38,000, and a PDI of 1.61.

TABLE 1

| Example | % Yield | $M_w$ | $M_w/M_n$ | $T_g$ (° C.) | $T_{d5}$ (° C.) | $T_{d50}$ (° C.) |
|---|---|---|---|---|---|---|
| (1) | 70 | 41,000 | 1.70 | 89 | 279 | 291 |
| (2) | 68 | 47,000 | 1.75 | 112 | 262 | 285 |
| (3) | 74 | 38,000 | 1.61 | 117 | 269 | 293 |

TABLE 2

| Example | $T_{d95}$ (° C.) | End Ph (%) | Mole % | Solubility @ RC = 20% |
|---|---|---|---|---|
| (1) | 298 | 10 | exo = 59 | A: soluble G: Insoluble |
| (2) | 309 | 18 | exo = 41 | A: soluble G: soluble |
| (3) | 315 | 17 | endo = 41 | A: soluble G: soluble |

Example 4

An appropriately sized reaction vessel equipped with a stir bar was charged with 10.0 g (43 mmol) of 5-exo-phenyl-cis-exo-2,3-norbornane dimethanol and 9.2 g (43 mmol) of diphenyl carbonate and 1.3 mg (0.16 mmol) of lithium hydride. A condensing arm was assembled, fitted to the reaction vessel and the vessel and condenser evacuated and refilled with nitrogen three times. The reaction flask was heated with stirring at 120° C. oil-bath temperature under nitrogen for 2 hours. The nitrogen source was removed, and the reaction was subjected to a partial vacuum of 75 Torr at 120° C. for 1 hour and allowed to cool to room temperature. The polymer solution in a mixture of methylene chloride and tetrahydrofuran was dropwise added to pure methanol during precipitation. After filtration and drying in a dynamic vacuum oven, 9.1 g white polymer was obtained. Polymer properties are summarized as follow: Mw=49 k, PDI=2.0, Tg=115 OC, Td50=284° C. The condensed material encompassed phenol (90%) and cyclic exo-phenyl-exo-norbornane ether (10%).

Example 5

With setup and handling procedures similar to Example 4, the monomers used in this experiment are 5.0 g (22 mmol) of 5-exo-phenyl-cis-endo-2,3-norbornane dimethanol and 4.6 g (22 mmol) of diphenyl carbonate. The catalyst lithium hydride used is 0.9 mg (0.11 mmol). Polymer solution in a mixture of methylene chloride and tetrahydrofuran was dropwise added to pure methanol during precipitation. After filtration and drying in a dynamic vacuum oven, 4.7 g white polymer was obtained. Polymer properties are summarized as follow: Mw=38 k, PDI=2.1, Tg=111° C., Td50=314° C. The condensed material encompassed phenol (96%) and cyclic exo-phenyl-endo-norbornane ether (4%).

Equation 1. Structure and Function of Thermally Latent Base Generator (PT-393)

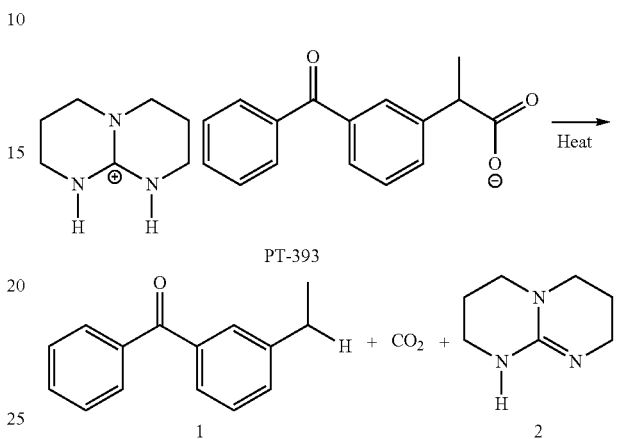

The photochemical decarboxylation mechanism of ketoprofen salts is known in photobase generators with protonated cations of DBU or DBN (See Journal of Photopolymer Science and Technology 2010, 23(1), 135-136 and Journal of Photopolymer Science and Technology 2009, 22(5), 663-666). While the concept in generation of a base (e.g., an amine) by photochemical decarboxylation has been well established for over 20 years (see Journal of Photopolymer Science and Technology 1990, 3(3), 419-422 and U.S. Pat. No. 5,545,509), it is equally known in the art that some molecules will not undergo spontaneous thermal decarboxylation (see Journal of Photopolymer Science and Technology 2006, 19(6), 683-684 and Journal of Photopolymer Science and Technology 1999, 12(2), 315-316). Observation of structures 1 and 2 in Equation 1 was confirmed by chemical ionization as PT-393 was heated in the absence of ultra-violet light, suggesting that a similar thermal decarboxylation process also takes place. As carbon dioxide is formed from the carboxylate group, a hydrogen is abstracted from the cation, thus releasing a base 1,5,7-triazabicyclo[4.4.0]dec-5-ene (TBD, 2) in-situ during reflow.

Since the base 2 is only generated from PT-393 upon heating, the room temperature polymer formulation of PT-393 is stable for at least one month. It does not contain free acid or free base, and is a non-corrosive formulation. The strong base generated upon reflow serves as the solder flux agent by removing oxide or contaminants from the metal surface. The strong base also initiates base-catalyzed chain scission and unzipping of the polycarbonate (Scheme 8b) part of the composition initially used in fixturing the solder components. The cyclic species generated from the polymer are volatile and will vaporize together with the carrier solvent under typical reflow conditions at >230° C. Typical carrier solvents such as γ-butyrolactone, anisole, and cyclopentanone have boiling points below 210° C. PT-393 shows the profile of a latent additive in TGA with 5% weight loss temperature (Td5) at 229° C. and is expected to be fully removed under reflow.

Example 6

Preparation of PT-393

2-(3-Benzoylphenyl)propanoic acid (ketoprofen, 8.00 g, 31.5 mmol) was dissolved in THF (100 mL) with magnetic stirring at room temperature. 1,5,7-Triazabicyclo[4.4.0]dec-5-ene (TBD, 4.38 g, 31.5 mmol) was slowly added as a dry powder to the clear THF solution—the temperature increase during this addition is minimal at the current level of dilution. The heterogeneous mixture was stirred vigorously at room temperature for 12 h, the turbidity gradually decreased over this period. The reaction mixture was filtered through Celite® filtering aid on a glass frit and the filtrate was concentrated to a viscous oil by rotary evaporation. Diethyl ether (15 mL) was added to the oily material and stirred for 30 min to remove unreacted ketoprofen and TBD. The top layer was removed with a Pasteur pipet and the ether wash was repeated twice. The supernatant from the last wash was kept in a closed vial at room temperature overnight and white crystals in mg scale are formed. The white crystals give 1H NMR similar to the crude mixture, and were collected as seeds for subsequent bulk crystallization. THF (30 mL) was added to the washed bulk material and swirled until homogeneous. Diethyl ether was dropwise added to the THF solution until the end point where one additional drop of ether will give a turbid solution even after swirling. A few seed crystals were added to the clear THF/ether mixture at the end point. After 4 h at room temperature, a layer of small white crystals was formed on the bottom glass surface. The mixture was kept in a refrigerator for 18 h. The white crystalline material was collected by filtration on a glass frit, and washed with 2×5 mL diethyl ether. The white solid was dried under oil-pump vacuum (≤0.1 Torr) for at least 12 h to remove residual traces of solvent and give 8.5 g (69%) white solid, which is confirmed as the desired product PT-393 by 1H NMR.

Example 7

Synthesis of exo-exo-2,3-Norbornanedicarboxylate Anhydride

Exo-,exo-2,3-norbornenedicarboxylate anhydride (94.4%, 634.23 g, 3.87 mol) was split into ~210 g portions and each dissolved via sonication and heat in 1.5-1.7 L ethyl acetate. Each portion was added to the 19 L Parr reactor and was followed with 3×400 mL ethyl acetate rinses. Total ethyl acetate used was 5.9 L. The Parr reactor had been pre-warmed to 30° C. to prevent recrystallization of the anhydride. 5% Pd/C (50% wet, 21.48 g) was added. The reactor was sealed and then pressurized with nitrogen three times. Then it was pressurized and flushed with hydrogen three times. The reactor was finally pressurized to 108 psi hydrogen and stirred at 230 rpm. After 19 min, the mixture was recharged from 17 to 105 psi. After 4 minutes, the reaction stabilized at 100 psi hydrogen. The mixture was allowed to stir at 100 to 86 psi and 26-31° C. overnight. NMR analysis revealed no more olefin remained. Four liters of dichloromethane was added to the reaction mixture. The reactor was drained and then rinsed with 3×2000 ml portions of dichloromethane. The reaction mixture and rinses were filtered through Celite to give a Pd/C-free clear filtrate. The filtrate was rotary evaporated at 20-70° C. to give 639 g hard solid (99.5% yield). GC analysis revealed 98.7% exo isomer and 0.9% endo isomer for 99.6% total isomer purity.

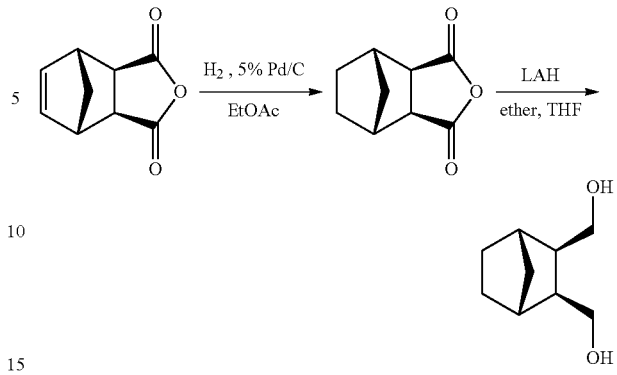

Example 8

Synthesis of exo-,exo-2,3-Norbornanedimethanol

Lithium aluminum hydride pellets (192.7 g, 5.08 mol) were added to 4000 ml anhydrous ether in a 4-neck 12 L flask fitted with mechanical stirrer, addition funnel, condenser with nitrogen inlet, and thermowell. The mixture was stirred overnight. Exo,exo-2,3-norbornanedicarboxylate anhydride (330.3 g) was dissolved in 850 ml DrySolve THF and added dropwise to the LAH slurry. Addition rate was adjusted to maintain a gentle reflux (up to 35° C.). When addition was complete, the addition funnel was recharged with 303.3 g exo-,exo-2,3-norbornanedicarboxylate anhydride in 1000 ml DrySolve THF. The fresh solution was added dropwise to maintain a gentle reflux (40.1° C.). Total exo,exo-2,3-norbornenedicarboxylate anhydride added was 633.6 g (3.81 mol). Total addition time was 11 hrs. GC analysis revealed 95% conversion with no unreacted starting material detected. The mixture was stirred overnight at room temperature. GC analysis showed 95.9% conversion. The reaction mixture was chilled to −12.4° C. and then 835 ml water was added dropwise. After 80 ml water had been added, the exotherm subsided and the remaining water was added quickly. The addition was complete after 2 h 20 min with the temperature ranging from −12.4° C. to +12.4° C. 1.25 L MTBE (methyl tert-butyl ether) was added. Then 1.05 L 10% aqueous $H_2SO_4$ was added to coagulate and separate the lithium and aluminum salts. The ether-THF-MTBE phase was decanted and washed with 2×1 L brine to remove carry-over solids and to bring the pH to 7. The ether solution was dried over sodium sulfate, filtered, and rotary evaporated to give 355.4 (60% yield) of oil. GC analysis showed 97.0% of the dimethanol (8.490 min retention time) and 2.3% unknown component at 6.16 min retention time.

Separation of the organic phase from the brine phase was obscured by the suspended solids. The brine washes were added back to the reactor to fluidize the remaining salts. The reactor flask was then rinsed with MTBE, which was added and thoroughly mixed with the brine mixture. No phase separation occurred. The brine mixture was filtered to remove the lithium and aluminum salts. This gave a clean separation of ~1000 ml organic phase from the brine phase. The organic phase was dried over sodium sulfate, filtered, and rotary evaporated to give 149.9 g of the dimethanol. GC analysis showed 89.6% purity with major impurities of 2.7% and 5.3% at 6.134 and 7.222 min retention time respectively.

The solid-free brine solutions were extracted with 400 ml and 800 ml MTBE. The MTBE extracts were dried over sodium sulfate, filtered, and rotary evaporated to give 25.8 of 92.1% of the dimethanol with 1.1% 6.144 min. retention time impurity and 6.6% 7.279 minute impurity.

The lithium and aluminum salts were washed with 2 L MTBE. The MTBE extract was washed with brine to pH 7, then dried over sodium sulfate, decanted, and rotary evaporated to 22.1 g 93% of the dimethanol. This sample had 2.1% and 15.1% impurities at 6.136 and 7.269 minutes respectively. These last three extracts were combined for a total of 197.8 g and kept distinct from the primary extract of 355.4 g.

The 355 g extract was vacuum distilled through a 12-inch Vigreux column where Fractions 4 through 7 were combined to give 120 g of product with 99.0% purity; and Fractions 8 through 10 were combined to give 157 g of product with 99.5% purity. Yield was 47%.

Formulation Example 1

Formulation of PPC in GBL

This set of procedures is generally applicable in exchanging the polymer solvent from acetone to any higher boiling solvent that is miscible with poly(propylene carbonate). Commercial poly(propylene carbonate) (PPC, $M_w$=40 k based on gel permeation chromatography measurements) was obtained in the form of a polymer solution in acetone. Gamma-butyrolactone (GBL) (451 g) is added to the commercial poly(propylene carbonate) with $M_w$=40 k in acetone (500 g, 36 wt %). A first fraction of solvent (221 g) was removed under vacuum (25 mmHg) at 54° C. by rotary evaporation. A second fraction of solvent (281 g) was removed under vacuum (29 mmHg) at 75° C. by rotary evaporation. The acetone content of the remaining polymer solution was found to be below reportable limit (0.05 wt %) by gas chromatography. (If the acetone content is above reportable limit, the solvent addition and evaporation cycle will be repeated until the acetone content in polymer solution is below reportable limit.) The final polymer solution was filtered through a 1 μm capsule into a particle-free container in a cleanroom environment. The container is capped and sealed with stretch tape for storage. The resin content was determined by removing all the solvent from a measured initial weight of a polymer solution sample using a Fisher Isotemp vacuum oven at 105° C. for 5 hours. The final solid polymer weight was compared to the initial solution weight to determine the resin content, which was found to be 57 wt %. The viscosity was determined with a Brookfield viscometer (Model DV I Prime) and found to be 20,000 cPs.

Formulation Example 2

PPC with a TABG in GBL

In general, formulations of lower viscosity than the solvent exchanged sample as described in Formulation Example 1 are prepared by diluting the viscous polymer sample with the carrier solvent typically inserted with an additive. As an example, thermally activated base generator PT-393 (0.28 g) in GBL (total solution weight 12.0 g) is added to a sample solution (19 g, 49 wt %) prepared following Example 1 to give a formulation of 31 wt % with 3 parts per hundred resin (pphr) of the thermally activated base generator. The formulation is roller mixed for 12 h and filtered through a 0.2 μm capsule into a particle-free container in a cleanroom environment. The container is capped and sealed with stretch tape.

Formulation Example 2a

PPC with a TABG and Formic Acid in GBL

Formulations with formic acid (FA) were prepared in an analogous manner to that of Formulation Example 2 but with the addition of formic acid. As an example, neat FA (0.96 g) was added to the polymer solution from Formulation Example 2. The solution was roller mixed for 12 h and filtered through a 0.2 μm capsule into a particle-free container in a cleanroom environment to give a formulation of 29 wt % resin content with 3 pphr PT-393 and 3 wt % FA.

Formulation Examples 3-31

Thermogravimetric Analyses of Formulated PPC

The preparation procedures for the formulations in these examples are analogous to that of Formulation Example 2. For all the examples in this series, the data collected is summarized in Tables 3 and 3a, below.

For each formulation the carrier solvent is GBL and either Novomer polypropylene carbonate have a molecular weight of either 40K or 160K was used. In addition, the specific TABG employed for each formulation and its loading in parts per hundred of the polymer (pphr) are provided.

Once the formulation was completed, it was spin-coated onto a four-inch silicon wafer at 1000 rpm. The coated wafer was then soft-baked for 5 minutes at 120 OC to give an approximately 5 μm thick film. Portions of the resultant uniform wafer film is lifted off the wafer, weighed into an aluminum pan (3 mg), and subjected to dynamic thermogravimetric analysis. The film material is heated at a ramp rate of 10° C./min from 25 to 500 OC while the temperature at a certain percent weight loss is recorded. The 50% weight loss temperature ($T_{d50}$) is 154° C. A collection of $T_{d50}$ data is summarized in Table 3. The $T_{d50}$ for unformulated poly(propylene carbonate) is 252° C.

TABLE 3

Summary of $T_{d50}$ Data of Formulated PPC

| Example | Polymer $M_w$ | Thermally Activated Base Generator | Loading (pphr) | $T_{d50}$ (° C.) |
|---|---|---|---|---|
| 3 | 40k | PT-393 | 5.0 | 154 |
| 4 | 40k | PT-393 | 3.0 | 163 |
| 5 | 40k | PT-393 | 2.0 | 177 |
| 6 | 40k | PT-393 | 1.0 | 183 |
| 7 | 40k | PT-393 | 1.0** | 123 |
| 8 | 40k | PT-393 | 0.5 | 191 |
| 9 | 40k | PT-393 | 0.5** | 121 |
| 10 | 40k | PT-407M | 5.0 | 179 |
| 11 | 40k | PT-407M | 3.0 | 186 |
| 12 | 40k | CXC-1761 | 5.0 | 255 |
| 13 | 40k | CXC-1761 | 3.0 | 254 |
| 14 | 40k | Et$_4$N OAc•4H$_2$O | 1.0 | 149 |
| 15 | 40k | Et$_4$N OAc•4H$_2$O | 0.75 | 152 |
| 16 | 40k | Et$_4$N OAc•4H$_2$O | 0.5 | 152 |
| 17 | 40k | Et$_4$N OAc•4H$_2$O | 0.25 | 146 |
| 18 | 40k | — | — | 252 |
| 19 | 160k | PT-393 | 3.0 | 177 |
| 20 | 160k | PT-393 | 1.7 | 188 |
| 21 | 160k | PT-393 | 1.0 | 200 |
| 22 | 160k | PT-393 | 1.0** | 148 |
| 23 | 160k | PT-393 | 0.5 | 207 |
| 24 | 160k | PT-393 | 0.5* | 163 |
| 25 | 160k | PT-407M | 3.0 | 188 |
| 26 | 160k | CXC-1761 | 3.0 | 255 |
| 27 | 160k | Et$_4$N OAc•4H$_2$O | 1.0 | 162 |

TABLE 3-continued

Summary of $T_{d50}$ Data of Formulated PPC

| Example | Polymer $M_w$ | Thermally Activated Base Generator | Loading (pphr) | $T_{d50}$ (° C.) |
|---|---|---|---|---|
| 28 | 160k | Et$_4$N OAc•4H$_2$O | 0.75 | 165 |
| 29 | 160k | Et$_4$N OAc•4H$_2$O | 0.5 | 175 |
| 30 | 160k | Et$_4$N OAc•4H$_2$O | 0.25 | 183 |
| 31 | 160k | — | — | 252 |

*0.25 phr Et$_4$N OAc•4H$_2$O added;
**0.5 phr Et$_4$N OAc•4H$_2$O added

Examples 18 and 31 were controls in that no TABG was added. As shown, both controls had a $T_{d50}$ of 252° C. Significant lowering of the $T_{d50}$ is seen for all formulation except for those that used CXC-1761. Also the expected higher $T_{d50}$ of each higher $M_w$ analog and the lower $T_{d50}$ for the more highly TABG loaded analogs is seen. Unexpected, however, is the dramatic effect of the addition of a small amount of Et$_4$N OAc.4H$_2$O to each of Examples 7, 9, 22 and 24 as compared to the analogous samples without the tetraethylamine salt.

Since the polymer composition embodiments in accordance with the present invention are expected to be sacrificial materials that upon heating to an effective temperature will decompose leaving little or no residue, the following Examples, summarized in Table 4, report the percent decomposition of the various formulations.

Formulation Examples 31-53

Thermal Decomposition of Formulated PPC

The formulation and wafer film preparation for this series of examples are similar to those described in Formulation Example 3 except the spin speed is increased to 3000 rpm for 2 μm thick film. The initial film thickness is measured by profilometry. The wafer film is subjected to thermal decomposition by heating each sample to in an oven. The letter appearing adjacent the Example Number is indicative of the heating cycle used for that Example. Thus for 'a' heat to 230° C. in less than or equal to 2 minutes and then holding the plate at that temperature for an additional 2 minutes; for 'b' heat to 240° C. and hold for 10 min; and for 'c' heat to 200° C. and hold for 10 min. For each Example the wafers were removed from the oven allow to cool to room temperature. Residue thickness of the residue on the wafer was subsequently measured and the percent material decomposed was calculated using the ratio of the residue thickness and the initial film thickness of the soft-baked sample. As it can be seen, all of the Examples demonstrated greater than 90% decomposition regardless of the initial film thickness, suggesting that the decomposition cycles employed were adequate and would require only minor experimentation to fine tune.

TABLE 4

Summary of Thermal Decomposition Data with Formulated PPC

| Example | Polymer $M_w$ | Thermally Activated Base Generator | Initial film thickness (μm) | Loading (pphr) | % Decomposed |
|---|---|---|---|---|---|
| 32a | 40k | PT-393 | 2.8 | 5.0 | 99.6 |
| 33a | 40k | PT-393 | 2.7 | 3.0 | 98.3 |
| 34b | 40k | PT-393 | 6.9 | 3.0 | >99.8 |
| 35b | 40k | PT-393 | 6.2 | 2.0 | >99.8 |
| 36b | 40k | PT-393 | 6.0 | 1.0 | >99.8 |
| 37b | 40k | PT-393 | 4.2 | 1.0** | 99.5 |
| 38b | 40k | PT-393 | 6.8 | 0.5 | 99.8 |
| 39b | 40k | PT-393 | 3.7 | 0.5** | 99.2 |
| 40c | 40k | PT-393 | 6.8 | 3.0 | 99.8 |
| 41c | 40k | Et$_4$N OAc•4H$_2$O | 6.0 | 0.25 | >99.8 |
| 42c | 40k | Et4N OAc•4H2O | 5.4 | 0.5 | >99.8 |
| 43a | 40k | — | 2.3 | — | 98.7 |
| 44b | 160k | PT-393 | 5.2 | 3.0 | 99.6 |
| 45b | 160k | PT-393 | 5.4 | 2.0 | 98.9 |
| 46b | 160k | PT-393 | 4.6 | 1.0 | 99.8 |
| 47b | 160k | PT-393 | 3.8 | 1.0** | 99.3 |
| 48b | 160k | PT-393 | 4.6 | 0.5 | 99.5 |
| 49b | 160k | PT-393 | 4.0 | 0.5* | 99.3 |
| 50c | 160k | PT-393 | 5.2 | 3.0 | 99.8 |
| 51c | 160k | Et4N OAc•4H2O | 5.9 | 0.25 | >99.8 |
| 52c | 160k | Et4N OAc•4H2O | 5.3 | 0.5 | >99.8 |
| 53b | 160k | — | 4.4 | — | 90.6 |

*0.25 phr Et$_4$N OAc•4H$_2$O added;
**0.5 phr Et$_4$N OAc•4H$_2$O added

Formulation Examples 54-78

Solder Flux Evaluation of PPC Formulations

The formulations in gamma-butyrolactone with a thermally activated base generator are prepared following procedures of Formulation Example 2, other than the formulation was dispensed as distinct spots with a 27-gauge needle onto a copper substrate (1.7 cm×3.4 cm) with a partly oxidized surface. A solder ball (Sn(99.3)Cu(0.7); 610 μm in diameter) was carefully transferred to the top of each of the spots on the copper substrate and then the entire plate mounted onto a device and heated to determine the amount of solder reflow exhibited. As the polymer composition embodiments in accordance with the present invention are directed to providing fluxing to enable solder interconnection between adjacent substrates, determining the amount of solder reflow by the method described above allows for the different TABG additives and their loading to be evaluated. For each example, the copper substrate was heated to 230° C. in less than or equal to 2 minutes and then held at that temperature for an additional 2 minutes before allowing the plate to return to room temperature. It was observed during the transfer of the plate carrying the carefully placed solder balls, that each spot of polymer composition held the solder ball placed thereon in position, thus demonstrating that such compositions are useful as a tacking agent. The diameter of the solder material was measured after reflow and as observed the controls, Examples 68 and 78 exhibited essentially no solder spread. Also, the low TABG loadings of Examples 66 and 69 for the Et$_4$N OAc.4H$_2$O TABG as compared to the higher loading for Examples 67 and 70 seem to indicate that the Et$_4$N OAc.4H$_2$O page requires a higher concentration of TABG to achieve adequate solder spread. It should also be observed from Table 5, that both formic acid and Et$_4$N OAc.4H$_2$O as additives to PT-393 have little if any effect on the solder spread observed for those samples as compared to analogous samples without such additives.

TABLE 5

Summary of Solder Flux Data with PPC Formulations in GBL

| Example | Polymer $M_w$ | Thermally Activated Base Generator | Loading (pphr) | Solder diameter after thermal reflow (μm) |
|---|---|---|---|---|
| 54 | 40k | PT-393 | 0.5 | 1117 |
| 55 | 40k | PT-393 | 0.5** | 1086 |
| 56 | 40k | PT-393 | 1.0 | 1135 |
| 57 | 40k | PT-393 | 1.0** | 1098 |
| 58 | 40k | PT-393 | 2.0 | 1129 |
| 59 | 40k | PT-393 | 3.0 | 1188 |
| 60 | 40k | PT-393 | 5.0 | 1244 |
| 61 | 40k | PT-393 | 5.0† | 1191 |
| 62 | 40k | PT-393 | 5.0‡ | 1209 |
| 63 | 40k | PT-393 | 8.0 | 1209 |
| 64 | 40k | PT-407M | 3.0 | 1098 |
| 65 | 40k | PT-407M | 8.0 | 1111 |
| 66 | 40k | Et$_4$N OAc•4H$_2$O | 0.5 | 612 |
| 67 | 40k | Et$_4$N OAc•4H$_2$O | 1.3 | 1086 |
| 68 | 40k | — | — | 591 |
| 69 | 160k | Et$_4$N OAc•4H$_2$O | 0.5 | 662 |
| 70 | 160k | Et$_4$N OAc•4H$_2$O | 1.3 | 1043 |
| 71 | 160k | PT-393 | 0.5* | 1074 |
| 72 | 160k | PT-393 | 1.0** | 1117 |
| 73 | 160k | PT-393 | 3.0 | 1098 |
| 74 | 160k | PT-407M | 5.0 | 982 |
| 75 | 160k | PT-407M | 8.0 | 1117 |
| 78 | 160k | — | — | 610 |

†3 wt % formic acid added;
‡5 wt % formic acid added;
*0.25 phr Et$_4$N OAc•4H$_2$O added;
**0.5 phr Et$_4$N OAc•4H$_2$O added

Formulation Examples 79-126

Storage Stability of PPC Formulations

The formulations in anisole of both the 40K and 160K Mw PPC Novomer polymer, with the various TABGs, were prepared in the manner of Example 2. As an example, a formulation of $M_w$=40 k poly(propylene carbonate) with PT-393 as the additive at 3 pphr loading in gamma-butyro-lactone is prepared and its $M_w$(Before) is determined by GPC. The formulation is kept at 25° C. for two weeks, and the $M_w$(After) is determined. The $M_w$ ratio in Table 6 is determined by $M_w$(After)/$M_w$(Before) to be 0.99. A $M_w$ ratio within the range of 0.95 to 1.05 is indicative that the formulation is stable for the stored period within experimental error. As shown, it was found that the stability of the compositions in Examples 95-102 were significantly worse than for the compositions that incorporated PT-393 as a TABG whether or not such compositions included formic acid (92 and 93) or the addition of Et$_4$N OAc.4H$_2$O (80a, 82a, 113 and 116). A list of storage stability data is summarized in Table 6.

TABLE 6

Summary of Storage Stability Data with PPC Formulations in GBL

| Example | Polymer | Additive | Loading | Temp | Time | $M_w$ Ratio |
|---|---|---|---|---|---|---|
| 79 | 40k | PT-393 | 0.5 | 25 | 2 | 1.03 |
| 80 | 40k | PT-393 | 0.5 | 25 | 5 | 1.01 |
| 80a | 40k | PT-393 | 0.5** | 25 | 2 | 1.00 |
| 81 | 40k | PT-393 | 1.0 | 25 | 2 | 1.01 |
| 82 | 40k | PT-393 | 1.0 | 25 | 5 | 1.01 |
| 82a | 40k | PT-393 | 1.0** | 25 | 2 | 1.02 |
| 83 | 40k | PT-393 | 2.0 | 25 | 2 | 0.96 |
| 84 | 40k | PT-393 | 2.0 | 25 | 5 | 0.99 |
| 85 | 40k | PT-393 | 3.0 | 25 | 2 | 0.99 |
| 86 | 40k | PT-393 | 3.0 | 25 | 4 | 0.96 |
| 87 | 40k | PT-393 | 3.0 | 25 | 8 | 1.01 |
| 88 | 40k | PT-393 | 3.0 | 25 | 24 | 1.04 |
| 89 | 40k | PT-393 | 5.0 | 25 | 2 | 0.99 |
| 90 | 40k | PT-393 | 5.0 | 25 | 4 | 0.98 |
| 91 | 40k | PT-393 | 5.0 | 25 | 8 | 0.95 |
| 92 | 40k | PT-393 | 5.0 | 25 | 24 | 0.96 |
| 93 | 40k | PT-393/FA | 5.0/3.0† | 25 | 2 | 1.01 |
| 94 | 40k | PT-393/FA | 5.0/3.0† | 25 | 8 | 1.01 |
| 95 | 40k | PT-407M | 3.0 | 25 | 2 | 0.98 |
| 96 | 40k | PT-407M | 3.0 | 25 | 5 | 0.99 |
| 98 | 40k | PT-407M | 3.0 | 25 | 16 | 0.85 |
| 99 | 40k | PT-407M | 5.0 | 25 | 16 | 0.75 |
| 100 | 40k | Bu$_4$N OAc | 1.5 | 25 | 1 | 0.98 |
| 101 | 40k | Bu$_4$N OAc | 1.5 | 25 | 2 | 0.77 |
| 102 | 40k | Bu$_4$N OAc | 1.5 | 25 | 4 | 0.55 |
| 103 | 40k | Et$_4$N OAc•4H$_2$O | 0.25 | 25 | 2 | 1.02 |
| 104 | 40k | Et$_4$N OAc•4H$_2$O | 0.25 | 25 | 5 | 1.01 |
| 105 | 40k | Et$_4$N OAc•4H$_2$O | 0.5 | 25 | 2 | 0.97 |
| 106 | 40k | Et$_4$N OAc•4H$_2$O | 0.5 | 25 | 5 | 0.95 |
| 107 | 40k | Et$_4$N OAc•4H$_2$O | 0.75 | 25 | 2 | 0.96 |
| 108 | 40k | Et$_4$N OAc•4H$_2$O | 0.75 | 25 | 5 | 0.74 |
| 109 | 40k | Et$_4$N OAc•4H$_2$O | 1.0 | 25 | 2 | 0.81 |
| 110 | 40k | Et$_4$N OAc•4H$_2$O | 1.0 | 25 | 5 | 0.60 |
| 111 | 160k | PT-393 | 0.5 | 25 | 2 | 1.02 |
| 112 | 160k | PT-393 | 0.5 | 25 | 5 | 1.04 |
| 113 | 160k | PT-393 | 0.5* | 25 | 2 | 1.00 |
| 114 | 160k | PT-393 | 1.0 | 25 | 2 | 0.98 |
| 115 | 160k | PT-393 | 1.0 | 25 | 5 | 1.01 |
| 116 | 160k | PT-393 | 1.0** | 25 | 2 | 1.01 |
| 117 | 160k | PT-393 | 2.0 | 25 | 2 | 1.01 |
| 118 | 160k | PT-393 | 2.0 | 25 | 5 | 1.06 |
| 119 | 160k | PT-393 | 3.0 | 25 | 2 | 0.99 |
| 120 | 160k | PT-393 | 3.0 | 25 | 5 | 1.00 |
| 121 | 160k | Et$_4$N OAc•4H$_2$O | 0.25 | 25 | 2 | 1.03 |
| 122 | 160k | Et$_4$N OAc•4H$_2$O | 0.25 | 25 | 5 | 1.02 |
| 123 | 160k | Et$_4$N OAc•4H$_2$O | 0.75 | 25 | 2 | 1.06 |
| 124 | 160k | Et$_4$N OAc•4H$_2$O | 0.75 | 25 | 5 | 1.05 |
| 125 | 160k | Et$_4$N OAc•4H$_2$O | 1.0 | 25 | 2 | 1.05 |
| 126 | 160k | Et$_4$N OAc•4H$_2$O | 1.0 | 25 | 5 | 1.07 |

†3 wt % formic acid added;
*0.25 phr Et$_4$N OAc•4H$_2$O added;
**0.5 phr Et$_4$N OAc•4H$_2$O added

Formulation Examples 127-129

Solder Flux Evaluation of Polynorbornanediol Carbonate Formulations

Solid cis-exo-2,3-polynorbornane dimethyl carbonate polymer (3.0 g) is dissolved in anisole to give a 10.0 g base polymer solution with 30 wt % resin content. A formulation of the indicated carbonate with the indicated TABG at a 3.0 pphr loading was prepared following procedures in Formulation Example 2 except that anisole was the solvent employed. As shown, each of Formulation Examples 127-129 demonstrate solder reflow, thus indicating the fluxing effect of the TABG employed. A list of solder flux data is summarized in Table 7.

TABLE 7

Summary of Solder Flux Data with Polynorbornanediol Carbonate Formulations in Anisole

| Example | Polymer | Additive | Loading (pphr) | Solder diameter after thermal reflow (μm) |
|---|---|---|---|---|
| 127 | cis-exo-2,3-polynorbornane dimethyl carbonate | PT-393 | 3.0 | 875 |
| 128 | poly(norbornane spirocarbonate) | PT-393 | 3.0 | 1206 |
| 129 | poly(norbornane spirocarbonate) | Bu$_4$N OAc | 1.5 | 1443 |

Formulation Examples 130-131

Thermal Decomposition of Formulated Polynorbornanediol Carbonates

The thermal decomposition of the polycarbonates of Formulation Examples 130 and 131 was evaluated. The wafer film preparation and thermal decomposition measurements for this series of examples was performed as previously described for Formulation Examples 31-53 except that a 3.9 μm thick film was generated, and only decomposition cycle 'a' was employed. The thermal decomposition data is summarized in Table 8.

TABLE 8

Summary of Thermal Decomposition Data of Formulated Polynorbornanediol Carbonates

| Example | Polymer | Additive | Initial film thickness (μm) | Loading (pphr) | % Decomposed |
|---|---|---|---|---|---|
| 130 | poly(norbornane spirocarbonate) | PT-393 | 3.9 | 3.0 | 99.5 |
| 131 | poly(norbornane spirocarbonate) | Bu$_4$N OAc | 3.8 | 1.5 | 93.4 |

Formulation Examples 132-133

Storage Stability of Formulated Polynorbornanediol Carbonates

The formulations in anisole with additives are prepared following procedures of Formulation Examples 127-129. After preparation, the polymer M$_w$(Before) was determined by GPC. Each formulation was kept at 65° C. for one week, and the polymer M$_w$(After) was determined. The M$_w$ ratio in Table 9 was determined by M$_w$(After)/M$_w$(Before) to be 0.95. It is believed that a M$_w$ ratio within the range of 0.95 to 1.05 is indicative that the formulation is stable for the stored period within experimental error.

TABLE 9

Summary of Storage Stability Data of Formulated Polynorbornanediol Carbonates

| Example | Polymer | Additive | Loading (pphr) | Temperature (° C.) | Time (week) | M$_w$ Ratio |
|---|---|---|---|---|---|---|
| 37 | poly(norbornane spirocarbonate) | PT-393 | 3.0 | 65 | 1 | 0.95 |

TABLE 9-continued

Summary of Storage Stability Data of Formulated Polynorbornanediol Carbonates

| Example | Polymer | Additive | Loading (pphr) | Temperature (° C.) | Time (week) | M$_w$ Ratio |
|---|---|---|---|---|---|---|
| 38 | poly(norbornane spirocarbonate) | Bu$_4$N OAc | 1.5 | 65 | 1 | 0.95 |

The data presented in Tables 6-9 includes examples that employed a Bu$_4$N OAc additive reported in WO2010075232 A1, to LaPointe et al., and entitled "Tunable Polymer Compositions". This data is provided for comparative purposes only as it is believed that the Bu$_4$N cation of such additive cannot act in the manner indicated in Scheme 8b.

Comparative Example

A formulation of PPC (M$_w$=160,000) was prepared including a thermal acid generator (TAG), specifically DAN FABA (dimethylanilinium tetrakis(pentafluorophenyl)borate) at 3.9 pphr loading. As DAN FABA has a formula weight of 800 (as compared to the formula weight of PT-393 of 393) this loading is about 10% higher loading that that of a PPC formulation encompassing a 1.7 pphr loading of PT-393. TGA analysis of the TAG containing formulation demonstrated a T$_{d50}$ of 206° C. while TABG formulation of Formulation Example 20 (shown in Table 3) demonstrated a T$_{d50}$ of 188° C.

Given the lower T$_{d50}$ shown by Formulation Example 20, than for the TAG formulation, it should be clear that TABG's are at least as effective in reducing the decomposition of a PPC as is a TAG.

By now it should be realized that polymer composition embodiments in accordance with the present invention have been shown useful for use in the methods described herein. As presented herein, it is shown that the additives in such polymer composition embodiments significantly lower the decomposition temperature of a polymer composition absent such additives, provide fluxing to enhance electrical connectivity through a solder reflow process and exhibit excellent storage properties.

Further it should be realized that both polyalkylene carbonates and polynorbornanediol carbonates can be employed to form sacrificial polymer compositions that are effective as both tack and flux agents when such compositions encompass an appropriate thermally activated base generator (TABG). Still further, it should be realized that the selection of such an appropriate TABG is a function of, among other things, it being able to provide a degree of solder spread sufficient to allow for an effective solder connection to be formed between two substrates as described above. Additionally, such appropriate TABG must not result in polymer degradation, depolymerization or decomposition until such is desired. Thus the results shown in Tables 6 and 9 are indicative that some sacrificial polymer compositions can be made that have remarkable room temperature stability, while Tables 4 and 8 demonstrate that such stable polymer compositions are capable of being, essentially, completely depolymerized and or decomposed. Thus, it should be realized that sacrifical polymer composition embodiments that encompass TABGs, and the sacrificial polymers thereof, have been disclosed and described herein where such sacrificial polymers and compositions can be claimed as embodiments in accordance with the present invention.

Still further, it should be realized that methods of using such sacrificial polymer compositions for the forming useful microelectronic or optoelectronic devices or structures thereof that make use of the aforementioned sacrificial polymer composition embodiments of the present invention. As previously described, some such device forming embodiments of the present invention encompass providing a first and a second substrate where each substrate has a surface that encompasses a plurality of first and second metal bumps or contact structures, respectively. It will be understood that each of the first and second substrates can be a microelectronic device such as a semiconductor chip or die so that a chip stack is formed, or that one of such substrates is a semiconductor chip and the other a substrate such as would be employed in forming a "flip-chip" assembly. Such substrates are positioned and held to one another by the tack properties of such composition, where each of the aforementioned plurality of metal bumps, or structures, are appropriately aligned and held in such alignment such that electrical coupling can be subsequently upon heating the substrates and polymer composition to an effective temperature, the solder will reflow to provide the aforementioned electrical coupling, the polymer composition providing a fluxing property to enable or enhance such electrical solder coupling, and where said polymer composition is further depolymerized or decomposed to leave essentially no residue between said first and second substrates.

The invention claimed is:

1. A sacrificial polymer composition comprising:
a polycarbonate selected from polypropylene carbonate or a polynorbornanediol carbonate polymer having a weight average molecular weight of from 2000 to 250,000 Dalton;
a thermally activated base generator represented by formula IV:

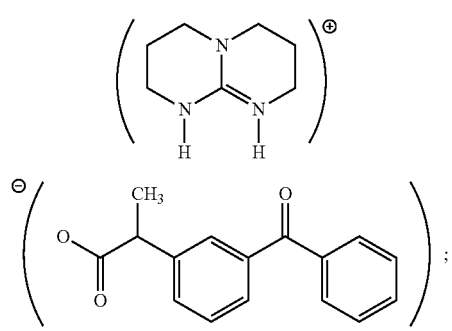

and
a solvent selected from anisole or gamma butyrolactone.

2. The sacrificial polymer composition of claim 1 where the solvent is gamma butyrolactone.

3. The sacrificial polymer composition of claim 1 where the thermally activated base generator loading is from 0.5 parts per hundred polymer to 8 parts per hundred polymer, inclusive.

4. The sacrificial polymer composition of claim 1, which comprises further a polycarbonate polymer comprising repeating units derived from one or more of endo-endo-2,3-norbornanedimethanol, exo-exo-2,3-norbornanedimethanol, endo-exo-2,3-norbornanedimethanol, exo-5-phenyl-exo-exo-2,3-norbornanedimethanol, exo-5-phenyl-endo-endo-2,3-norbornanedimethanol, norbornane spirocarbonate, and phenyl norbornane spirocarbonate.

5. The sacrificial polymer composition of claim 1 where the thermally activated base generator further comprises $Et_4N\ OAc\cdot4H_2O$.

6. A sacrificial polymer composition comprising:
a polycarbonate selected from polybutylene carbonate, polycyclohexylene carbonate and a norbornanediol carbonate polymer derived from a monomer of formula A, B or C:

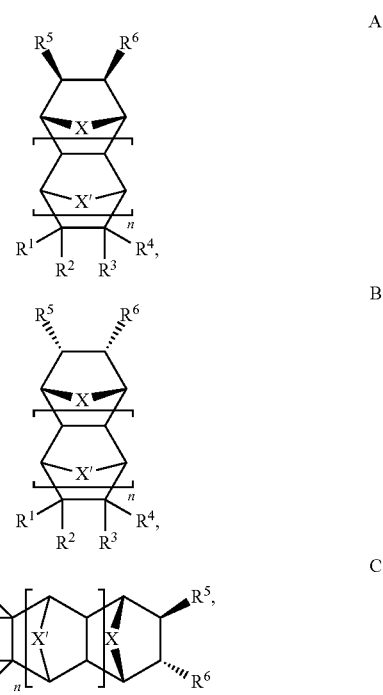

wherein:
n is independently 0, 1 or 2;
each of $R^1$, $R^2$, $R^3$ and $R^4$ is independently selected from hydrogen or a hydrocarbyl group containing from 1 to 25 carbon atoms;
each of $R^5$ and $R^6$ are independently selected from —$(CH_2)_p$—OH, where p is 0, 1, 2 or 3; and
each of X and X' is independently selected from —$CH_2$—, —$CH_2$—$CH_2$— and —O—, where each X', if present, oriented the same or opposite the orientation of X;
or a blend thereof wherein said polycarbonate having a weight average molecular weight of from 2000 to 250,000 Dalton;
a thermally activated base generator selected from:

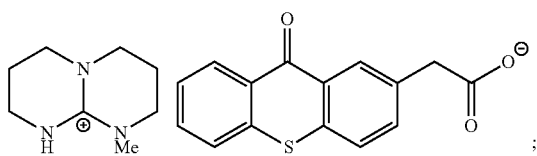

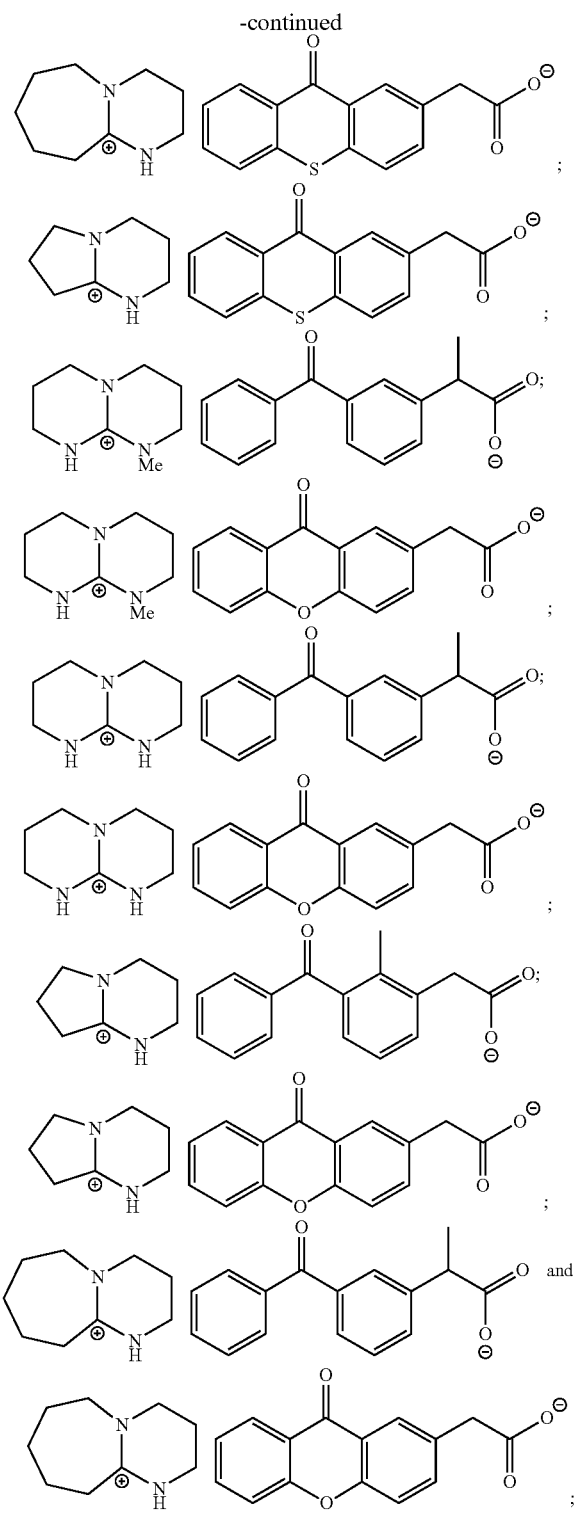

and
a solvent selected from anisole or gamma butyrolactone.

7. The sacrificial polymer composition of claim 6 where p is 1, 2 or 3.

8. The sacrificial polymer composition of claim 6 where the sum of the p for $R^5$ and p for $R^6$ is either 1 or 3.

9. The sacrificial polymer composition of claim 6 where the polycarbonate is a norbornanediol carbonate polymer derived from a monomer of Formulae A1, B1 and C1,

  A1

  B1

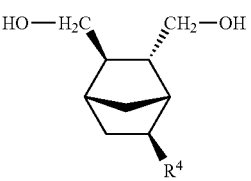  C1 wherein:
$R^4$ is independently selected from an alkyl, cycloalkyl, heteroalkyl, heterocycloalkyl, aryl, heteroaryl or aralkyl group.

10. The sacrificial polymer composition of claim 6 where the solvent is gamma butyrolactone.

11. The sacrificial polymer composition of claim 6 where the thermally activated base generator is represented by formula IV:

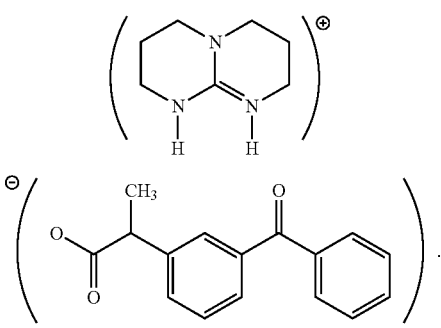  IV

12. The sacrificial polymer composition of claim 11 where the solvent is gamma butyrolactone.

13. The sacrificial polymer composition of claim 6 where the thermally activated base generator loading is from 0.5 parts per hundred polymer to 8 parts per hundred polymer, inclusive.

14. The sacrificial polymer composition of claim 6, where the norbornanediol carbonate polymer is derived from one or more monomers selected from endo-endo-2,3-norbornanedimethanol, exo-exo-2,3-norbornanedimethanol, endo-exo-2,3-norbornanedimethanol, exo-5-phenyl-exo-exo-2,3-norbornanedimethanol and exo-5-phenyl-endo-endo-2,3-norbornanedimethanol.

15. The sacrificial polymer composition of claim 6, where the thermally activated base generator further comprises $Et_4N\ OAc\cdot4H_2O$.

16. The sacrificial polymer composition of claim 6, where the norbornanediol carbonate polymer is derived from endo-endo-2,3-norbornanedimethanol.

17. The sacrificial polymer composition of claim 6, where the norbornanediol carbonate polymer is derived from exo-exo-2,3-norbornanedimethanol.

18. The sacrificial polymer composition of claim 6, where the norbornanediol carbonate polymer is derived from endo-exo-2,3-norbornanedimethanol.

19. The sacrificial polymer composition of claim 6, where the norbornanediol carbonate polymer is derived from exo-5-phenyl-exo-exo-2,3-norbornanedimethanol.

20. The sacrificial polymer composition of claim 6, where the norbornanediol carbonate polymer is derived from exo-5-phenyl-endo-endo-2,3-norbornanedimethanol.

\* \* \* \* \*